(12) United States Patent
Edwards et al.

(10) Patent No.: US 9,861,013 B2
(45) Date of Patent: Jan. 2, 2018

(54) COOLING SYSTEM WITH INTEGRATED FILL AND DRAIN PUMP

(71) Applicant: INTERNATIONAL BUSINESS MACHINES CORPORATION, Armonk, NY (US)

(72) Inventors: David L. Edwards, Poughkeepsie, NY (US); Gary F. Goth, Pleasant Valley, NY (US); Daniel J. Kearney, Ulster Park, NY (US); Peter W. Kelly, Stone Ridge, NY (US); Francis R. Krug, Jr., Highland, NY (US); Robert K. Mullady, Pougkeepsie, NY (US); Donald W. Porter, Highland, NY (US); Allan C. VanDeventer, Poughkeepsie, NY (US); Randy J. Zoodsma, Poughkeepsie, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 245 days.

(21) Appl. No.: 14/620,476

(22) Filed: Feb. 12, 2015

(65) Prior Publication Data
US 2016/0242319 A1    Aug. 18, 2016

(51) Int. Cl.
*H05K 7/20* (2006.01)
*F04D 1/02* (2006.01)
(Continued)

(52) U.S. Cl.
CPC .......... *H05K 7/20781* (2013.01); *F04D 9/00* (2013.01); *F04D 13/12* (2013.01); *F04D 25/16* (2013.01);
(Continued)

(58) Field of Classification Search
CPC ........ F04D 1/02; F04D 13/12; F04D 15/0088; F04D 29/586; F04D 25/16; F04D 9/00;
(Continued)

(56) References Cited

U.S. PATENT DOCUMENTS 7,775,061 B2     8/2010   Dorrich et al.
7,832,925 B2 *  11/2010   Archibald ................. G06F 1/20
                                                        165/287
(Continued)

FOREIGN PATENT DOCUMENTS

CN     103957683 A    7/2014
EP     1 614 973 A2   1/2006

OTHER PUBLICATIONS

Edwards, David L., "Cooling System with Integrated Fill and Drain Pump", U.S. Appl. No. 14/846,894, filed Sep. 7, 2015 (55 pages).
(Continued)

*Primary Examiner* — Mohammad M Ali
(74) *Attorney, Agent, or Firm* — Margaret A. McNamara, Esq.; Kevin P. Radigan, Esq.; Heslin, Rothenberg, Farley & Mesiti

(57) ABSTRACT

A cooling system is provided which includes, for instance, a coolant circulation loop, one or more primary coolant pumps, and a fill and drain pump. The primary coolant pump(s) is coupled to facilitate circulating coolant through the coolant circulation loop, and the fill and drain pump facilitates selective filling of the cooling system with the coolant, or draining of the coolant from the cooling system. The fill and drain pump is integrated with the cooling system as a backup coolant pump to the primary coolant pump(s), and circulates the coolant through the coolant circulation loop responsive to an error in the primary coolant pump(s). The primary coolant pump(s) and fill and drain pumps may be different types of pumps, and the cooling system further includes a control system for automatically activating the fill
(Continued)

and drain pump upon detection of an error in the primary coolant pump(s).

18 Claims, 16 Drawing Sheets

(51) Int. Cl.
*F04D 13/12* (2006.01)
*F04D 15/00* (2006.01)
*F28D 15/00* (2006.01)
*F04D 9/00* (2006.01)
*F04D 25/16* (2006.01)
*F04D 29/58* (2006.01)

(52) U.S. Cl.
CPC ....... *F04D 29/586* (2013.01); *H05K 7/20254* (2013.01); *H05K 7/20272* (2013.01); *F28F 2265/06* (2013.01)

(58) Field of Classification Search
CPC ........... H05K 7/20745; H05K 7/20781; H05K 7/20272; H05K 7/20254; F28D 15/00; F28D 2265/06; F28F 2265/06
USPC .............. 62/231; 361/688; 165/287; 137/387
See application file for complete search history.

(56) References Cited

U.S. PATENT DOCUMENTS

| | | | |
|---|---|---|---|
| 8,297,069 B2 | 10/2012 | Novotny et al. | |
| 8,305,757 B2* | 11/2012 | Keisling | H05K 7/20827 165/104.33 |
| 2005/0237714 A1 | 10/2005 | Ebermann | |
| 2006/0126293 A1 | 6/2006 | Campbell et al. | |
| 2007/0227710 A1 | 10/2007 | Belady et al. | |
| 2009/0100848 A1* | 4/2009 | Kuriyama | H05K 7/20745 62/132 |
| 2009/0120622 A1 | 5/2009 | Koch | |
| 2009/0126385 A1 | 5/2009 | Trepte | |
| 2009/0150123 A1* | 6/2009 | Archibald | G06F 17/5004 703/1 |
| 2009/0150133 A1* | 6/2009 | Archibald | G06F 17/5009 703/9 |
| 2009/0207564 A1* | 8/2009 | Campbell | G01F 1/6965 361/688 |
| 2009/0207880 A1* | 8/2009 | Ahladas | G01K 13/00 374/141 |
| 2011/0146715 A1* | 6/2011 | Rolek | A47L 15/0021 134/18 |
| 2012/0000535 A1* | 1/2012 | Poyner | A47L 15/0049 137/1 |
| 2012/0180979 A1 | 7/2012 | Harrington | |
| 2013/0133350 A1 | 5/2013 | Reytblat | |

OTHER PUBLICATIONS

Edwards, David L., "List of IBM Patents and/or Patent Applications Treated as Related", U.S. Appl. No. 14/620,476, filed Feb. 12, 2015, dated Mar. 10, 2016 (2 pages).

Hewlett-Packard Development Company, L.P., "HP Modular Cooling System: Water Cooling Technology for High-Density Server Installations", Technical Brief (Apr. 2007) (15 pages).

R. Schmidt et al., "High-End Server Low Temperature Cooling", IBM Journal of Res. & Dev., vol. 46, No. 6 (Nov. 2002) (pp. 739-751).

Edwards, David L., Office Action for U.S. Appl. No. 14/846,894, filed Sep. 7, 2015 (U.S. Patent Publication No. 2016/0242326 A1), dated May 24, 2017 (12 pages).

* cited by examiner

COOLING SYSTEM WITH INTEGRATED FILL AND DRAIN PUMP

BACKGROUND

The power dissipation of integrated circuit chips, and the modules containing the chips, continues to increase in order to achieve increases in processor performance. This trend continues to pose cooling challenges at the module and system levels.

In many large server applications, processors along with their associated electronics (e.g., memory, disk drives, power supplies, etc.) are packaged in removable drawer configurations stacked within an electronics rack or frame comprising information technology (IT) equipment. In other cases, the electronics may be in fixed locations within the rack or frame. Conventionally, the components have been cooled by air moving in substantially parallel airflow paths, usually front-to-back, impelled by one or more air moving assemblies (e.g., axial or centrifugal fans). In some cases it has been possible to handle increased power dissipation within a single drawer or system by providing greater airflow, for example, through the use of more powerful air moving assemblies or by increasing the rotational speed (i.e., RPMs) of the fan mechanisms. However, this approach is becoming problematic at the different cooling levels. As an enhancement, liquid-cooling is an attractive technology to selectively manage the higher heat fluxes. The liquid absorbs the heat dissipated by the components/modules in an efficient manner. Typically, the heat is ultimately transferred from the liquid coolant to a heat sink, whether air or other liquid-based.

BRIEF SUMMARY

The shortcomings of the prior art are addressed and additional advantages are provided through the provision, in one aspect, of a system which includes a cooling system for cooling one or more electronic components. The cooling system includes: a coolant circulation loop; at least one primary coolant pump coupled to facilitate circulating coolant through the coolant circulation loop; and a fill and drain pump to facilitate selective filling of the cooling system with the coolant, or draining of the coolant from the cooling system, the fill and drain pump being integrated with the cooling system as a backup coolant pump to the at least one primary coolant pump, and the fill and drain pump circulating the coolant through the coolant circulation loop responsive to an error in the at least one primary coolant pump.

In another aspect, a cooled electronic assembly is provided which includes multiple electronic systems to be cooled, and a cooling system for cooling the multiple electronic systems. The cooling system includes: a coolant circulation loop comprising a coolant supply manifold and a coolant return manifold; multiple cooling assemblies coupled in parallel-fluid communication between the coolant supply manifold and the coolant return manifold to receive coolant from the coolant supply manifold, and exhaust coolant to the coolant return manifold, the multiple cooling assemblies being associated with the multiple electronic systems to facilitate removal of heat from the multiple electronic systems to coolant within the multiple cooling assemblies; a heat exchange assembly coupled in fluid communication with the coolant circulation loop to dissipate heat from the coolant passing therethrough; at least one primary coolant pump coupled to facilitate circulating coolant through the coolant circulation loop; and a fill and drain pump to facilitate selective filling of the cooling system with the coolant, or draining of the coolant from the cooling system, the fill and drain pump being integrated with the cooling system as a backup coolant pump to the at least one primary coolant pump, the fill and drain pump circulating the coolant through the coolant circulation loop based on an error in the at least one primary coolant pump.

In a further aspect, a method is provided which includes providing a cooling system, the providing including: providing a coolant circulation loop; providing at least one primary coolant pump coupled to facilitate circulating coolant through the coolant circulation loop; and integrating a fill and drain pump with the cooling system to facilitate selective filling of the cooling system with the coolant, or draining of the coolant from the cooling system, the fill and drain pump being integrated with the cooling system as a backup coolant pump to the at least one primary coolant pump, the fill and drain pump circulating the coolant through the coolant circulation loop responsive to an error in the at least one primary coolant pump.

Additional features and advantages are realized through the techniques of the present invention. Other embodiments and aspects of the invention are described in detail herein and are considered a part of the claimed invention.

BRIEF DESCRIPTION OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

DETAILED DESCRIPTION

Reference is made below to the drawings, wherein the same or similar reference numbers used throughout different figures designate the same or similar components.

Figure 1:
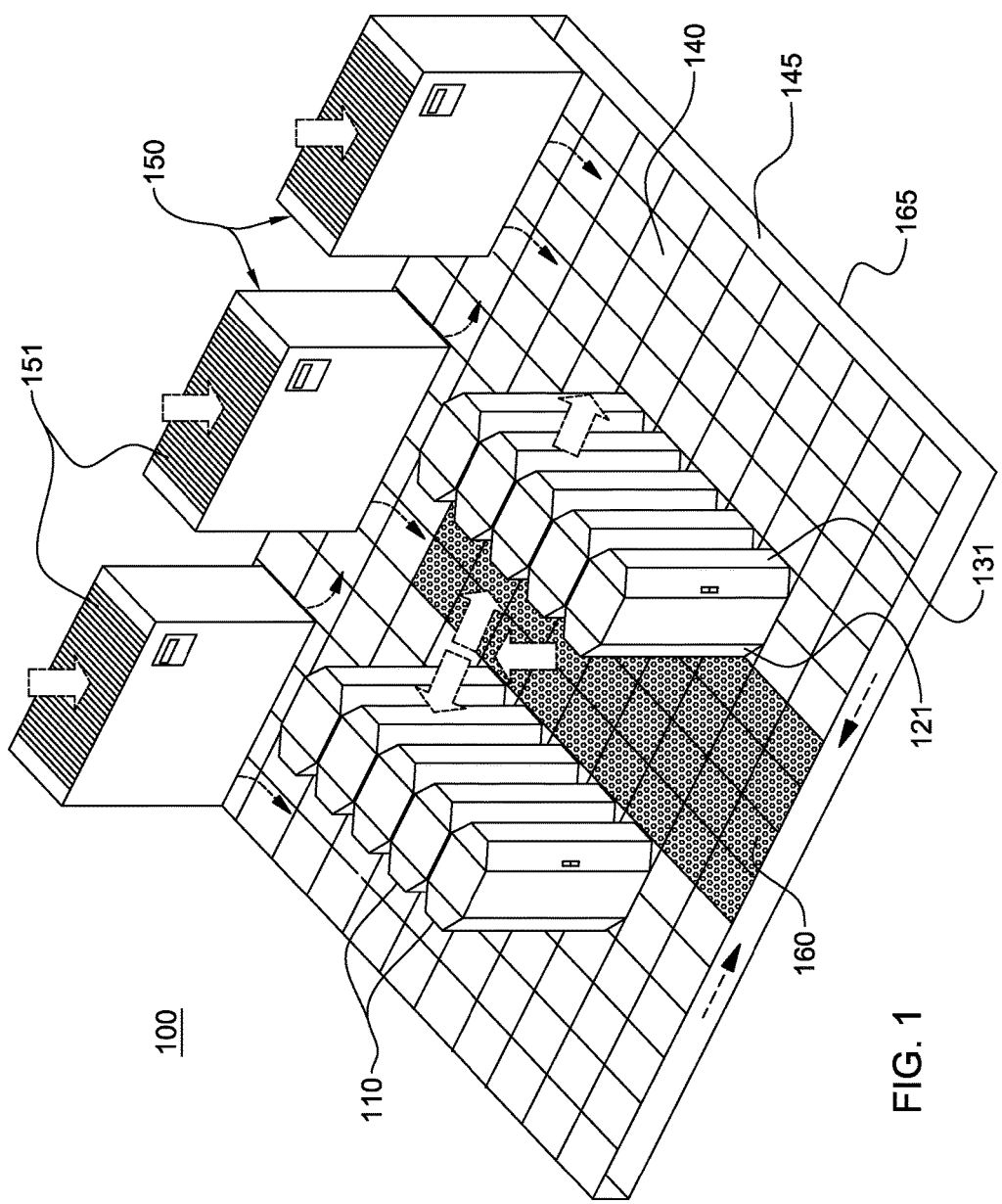
FIG. 1 depicts one embodiment of a raised floor layout of an air-cooled data center, which may employ one or more cooling systems, in accordance with one or more aspects of the present invention.

As shown in FIG. 1, in one implementation of a raised floor layout of an air-cooled data center 100, multiple electronics racks 110 are disposed in one or more rows. Note that "electronics rack", "rack unit", "rack", "information technology (IT) infrastructure", etc., may be used interchangeably herein, and unless otherwise specified, include any housing, frame, support, structure, compartment, etc., having one or more heat-generating components of a computer system, electronic system, IT system, etc. A computer installation such as depicted in FIG. 1 may house several hundred, or even several thousand microprocessors. In the arrangement of FIG. 1, chilled air enters the computer room via floor vents from a supply air plenum 145 defined between a raised floor 140 and a base or sub-floor 165 of the room. Cooled air is taken in through louvered covers at air inlet sides 121 of the electronics racks and expelled through the back (i.e., air outlet sides 131) of the electronics racks. Electronics racks 110 may have one or more air-moving devices (e.g., axial or centrifugal fans) to provide forced inlet-to-outlet air flow to cool the electronic components within the rack units. The supply air plenum 145 provides (in one embodiment) conditioned and cooled air to the air-inlet sides of the electronics racks via perforated floor tiles 160 disposed in a "cold" aisle of the computer installation. The cooled air is supplied to plenum 145 by one or more air conditioning units 150, also disposed within data center 100. Room air may be taken into each air conditioning unit 150 near an upper portion thereof. This room air may comprise (in part) exhausted air from the "hot" aisles of the computer installation defined by opposing air outlet sides 131 of the electronics racks 110.

Figure 2:
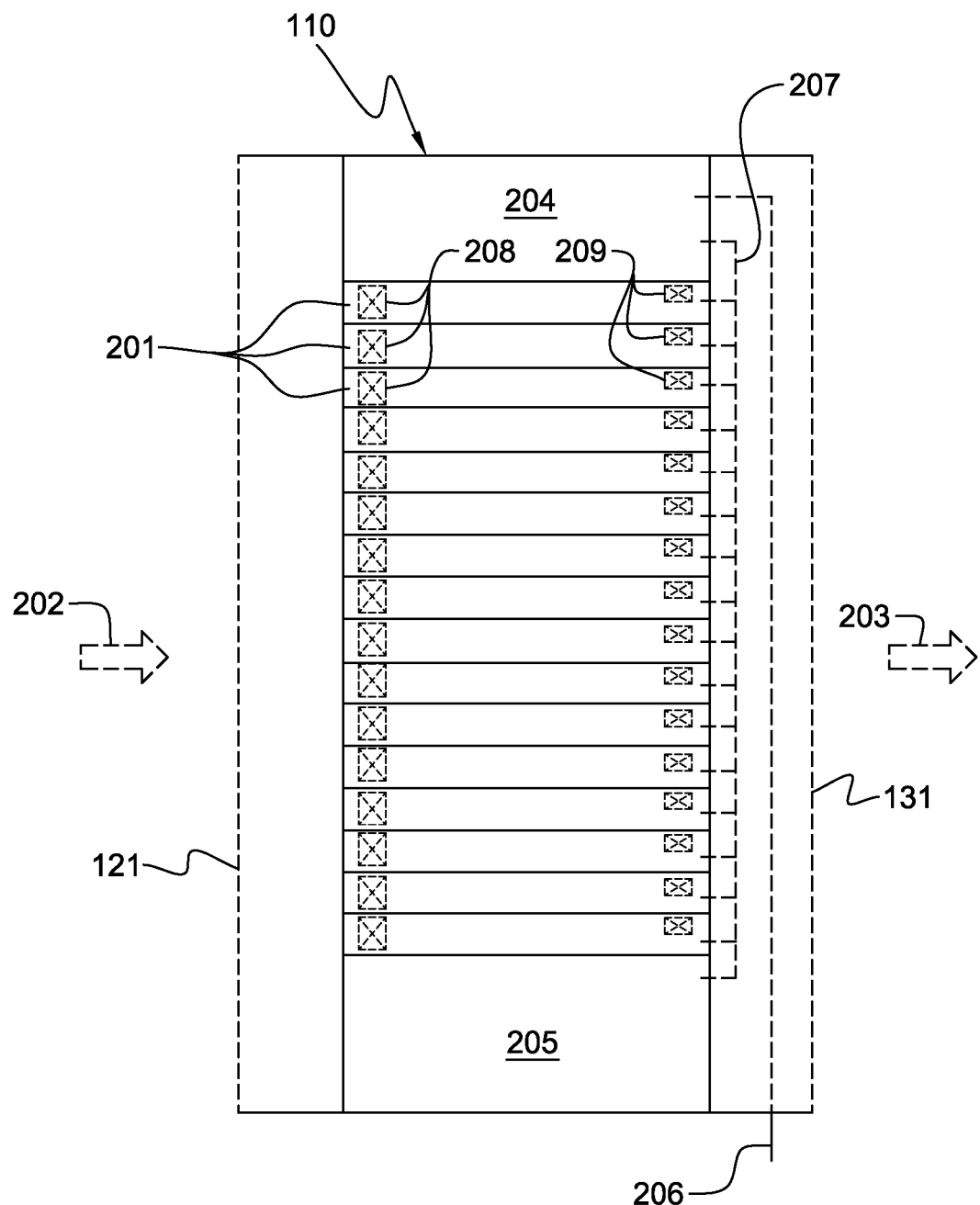
FIG. 2 is a cross-sectional elevational view of one implementation of an electronics rack for a data center, which may employ a cooling system, in accordance with one or more aspects of the present invention.

FIG. 2 depicts (by way of example) one embodiment of an electronics rack 110 with a plurality of electronic systems 201 to be cooled. In the embodiment illustrated, electronic systems 201 are air-cooled by cool airflow 202 ingressing via air inlet side 121, and exhausting out air outlet side 131 as heated airflow 203. By way of example, one or more air-moving assemblies 208 may be provided at the air inlet sides of electronic systems 201 and/or one or more air-moving assemblies 209 may be provided at the air outlet sides of electronic systems 201 to facilitate airflow through the individual systems 201 as part of the cooling apparatus of electronics rack 110. For instance, air-moving assemblies 208 at the air inlets to electronic systems 201 may be or include axial fan assemblies, while air-moving assemblies 209 disposed at the air outlets of electronic systems 201 may be or include centrifugal fan assemblies. One or more electronic systems 201 may include heat-generating components to be cooled of, for instance, an electronic subsystem, and/or information technology (IT) equipment. More particularly, one or more of the electronic systems 201 may include one or more processors and associated memory.

In one embodiment, electronics rack 110 may also include, by way of example, one or more bulk power assemblies 204 of an AC to DC power supply assembly. AC to DC power supply assembly further includes, in one embodiment, a frame controller, which may be resident in the bulk power assembly 204 and/or in one or more electronic systems 201. Also illustrated in FIG. 2 is one or more input/output (I/O) drawer(s) 205, which may also include a switch network. I/O drawer(s) 205 may include, as one example, PCI slots and disk drivers for the electronics rack.

In the depicted implementation, a three-phase AC source feeds power via an AC power supply line cord 206 to bulk power assembly 204, which transforms the supplied AC power to an appropriate DC power level for output via distribution cable 207 to the plurality of electronic systems 201 and I/O drawer(s) 205. The number of electronic systems installed in the electronics rack is variable, and depends on customer requirements for a particular system. Note that the particular electronics rack 110 configuration of FIG. 2 is presented by way of example only, and not by way of limitation. In particular, FIGS. 3-12 depict, in part, other alternate implementations of an electronics rack and cooling approaches, in accordance with one or more aspects of the present invention.

Figure 3:
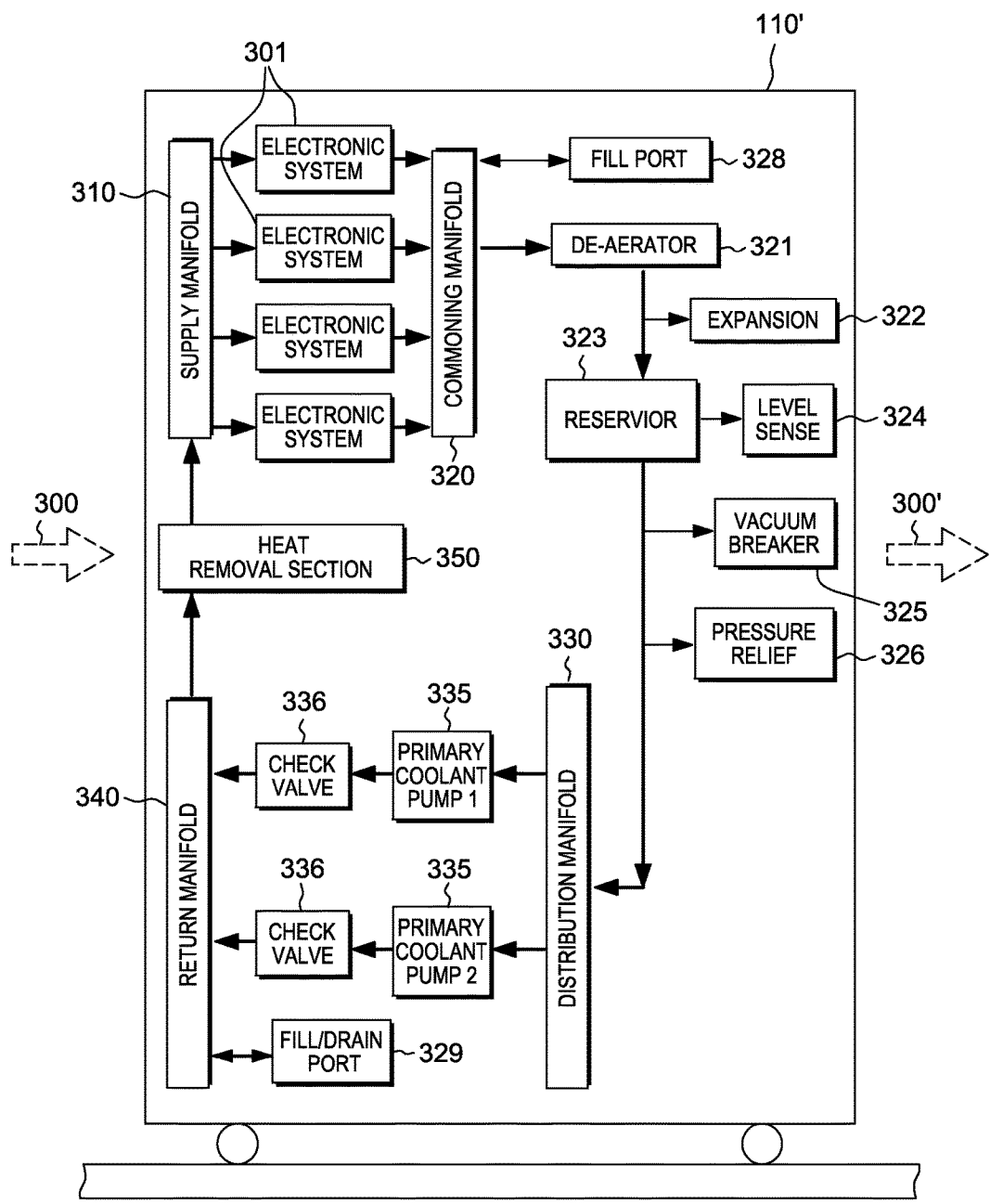
FIG. 3 is a schematic of one embodiment of a cooled electronics assembly or rack having multiple electronic systems and a cooling system, in accordance with one or more aspects of the present invention.

Referring first to FIG. 3, a schematic diagram is presented of one embodiment of a cooled electronic assembly configured as a cooled electronics rack 110', which includes multiple electronic systems 301 and a cooling system, which may be disposed fully or partially internal to the electronics rack, or in an alternate implementation, partially external, and even remote from the electronics rack. In the depicted implementation, electronic systems 301 each have an associated cooling assembly (or heat removal structure) of the cooling system. By way of example, one or more of the cooling assemblies may comprise one or more coolant-cooled cold plates, or one or more coolant-immersion housings depending, for instance, whether indirect or direct liquid-assisted cooling is desired. The cooling system further includes a coolant supply manifold 310 and a coolant-commoning manifold 320, with the multiple cooling structures being coupled in parallel fluid communication between coolant supply manifold 310 and coolant-commoning manifold 320 to receive coolant from the coolant supply manifold, and exhaust coolant to the coolant-commoning manifold. Note that one example of the coolant is water, or an aqueous-based solution. However, the concepts disclosed herein are readily adapted to use with other types of coolant. For example, the coolant may comprise a brine, a dielectric liquid, a fluorocarbon liquid, a metal liquid, or other coolant, or refrigerant, while still maintaining the advantages and unique features of the present invention.

FIG. 3 depicts an example of a closed-loop cooling system, with multiple control and monitor components that allow the system to operate reliably. These components include one or more de-aerators 321 to remove dissolved gasses from the coolant, a coolant expansion structure 322 to accommodate expansion of coolant within the cooling system, a reservoir 323, one or more level sensors 324 associated with reservoir 323 to sense level of coolant within the cooling system, a vacuum breaker 325 coupled to the coolant loop of the cooling system to prevent cavitation of the pumping assembly, and a pressure-relieve valve 326 associated with the coolant loop to ensure that the cooling system does not over-pressurize. A fill port 328 may be provided at the top of the cooling system, and a fill/drain port 329 may be provided in a lower portion of the cooling system. As shown, reservoir 323 functions to supply coolant to a distribution manifold 330 of a pumping assembly, which includes multiple primary coolant pumps 335, primary coolant pump 1, primary coolant pump 2, each with an associated downstream check valve 336. Further, the pumping assembly includes a return manifold 340. As illustrated, the primary coolant pumps 335 of the pumping assembly are coupled in parallel fluid communication between distribution manifold 330 and return manifold 340. In one implementation, the primary coolant pumps 335 are modular pumping units (MPUs), which may be individually, selectively replaced concurrent with continued operation of the cooling system of the cooled electronic assembly depicted. Note that, in one implementation, the components of the cooling system of FIG. 3 are discrete components which fulfill the above-described functions.

As illustrated, the cooling system further includes a heat removal section 350, coupled in fluid communication between return manifold 340 of the pump assembly and coolant supply manifold 310. By way of example, heat removal section 350 includes one or more coolant-to-air heat exchangers with one or more associated fan mechanisms (e.g., axial or centrifugal fans) to facilitate air-cooling of coolant within the heat exchanger(s) by flowing cooled air 300 across heat removal section 350. As used herein, "coolant-to-air heat exchanger" means any heat exchange mechanism characterized as described herein, across which air passes and through which coolant, such as liquid coolant, can circulate; and includes, one or more discrete heat exchangers, coupled either in series or in parallel. A coolant-to-air heat exchanger may comprise, for example, one or more coolant flow paths, formed of thermally conductive tubing (such as copper or other tubing) thermally coupled to a plurality of fins across which air passes. Size, configuration and construction of the coolant-to-air heat exchanger can vary without departing from the scope of the invention disclosed herein.

After passing across heat removal section 350, the heated air egresses from the rack unit as heated air 300'. Note that in an alternate embodiment, the heat removal section could include one or more coolant-to-coolant heat exchangers, or one or more liquid-to-liquid heat exchangers, to reject heat from the coolant circulating through the cooling system. For instance, the heat could be rejected to facility-chilled water where available, rather than to cooled air 300.

In operation, heat generated within the electronic systems 301 is extracted by coolant flowing through (for example) respective cooling structures associated therewith, such as cold plates, and is returned via the coolant-commoning manifold 320 and the active primary coolant pump(s) 335, for example, for rejection of the heat from the coolant to the cooled ambient air 300 passing across the heat exchanger in heat removal section 350. In one implementation, only one primary coolant pump 335 may (depending on the mode) be active at a time, and the coolant pump redundancy allows for, for example, servicing or replacement of an inactive pumping unit from the cooling system, without requiring shut-off of the electronic systems being cooled. By way of specific example, quick connect couplings may be employed, along with appropriately sized and configured hoses to couple, for example, the heat exchanger, cold plates, supply and return manifolds, reservoir and pumping units. Redundant fan mechanisms, such as redundant centrifugal fans, with appropriate, redundant drive cards or controllers, may be mounted to direct cooled air 300 across the heat exchanger(s) of the heat removal section. These controllers may be in communication with a system-level controller (not shown), in one embodiment. In one normal mode implementation, the multiple fan mechanisms may be running at the same time.

Note again that, although described above with reference to one or more coolant-to-air heat exchangers, the cooling system(s) disclosed herein may provide pumped coolant (such as water) for circulation through various types of heat exchange assemblies, including one or more coolant-to-air heat exchangers, one or more coolant-to-coolant heat exchangers, a rack-mounted door heat exchanger, a coolant-to-refrigerant heat exchanger, etc. Further, the heat exchange assembly may comprise more than one heat exchanger, including more than one type of heat exchanger, depending upon the implementation. The heat exchange assembly, or more generally, heat removal section, could be within the cooled electronics rack, or positioned remotely from the rack.

In FIG. 3, a closed-loop cooling system is illustrated which incorporates a number of components that ensure that the cooling system works reliably. These include, but are not necessarily limited to: a coolant reservoir; coolant level sensors; a coolant expansion region; one or more vacuum breakers; one or more pressure-relieve valves; a pumping assembly which may include multiple modular pumping units; distribution and return manifolds for pump flow through one or more parallel-coupled pumping units of the pump assembly; check valves to prevent back flow through one or more inactive pumps of the pump assembly; a separate de-aerator facility to remove air or other gasses from the coolant within the cooling system; a supply manifold to distribute coolant to multiple cooling structures coupled in parallel; a coolant supply manifold; a return manifold to receive exhaust coolant from the multiple cooling structures; a heat removal section or mechanism, such as a coolant-to-air heat exchanger; and fill and drain ports for filling and draining the cooling system.

In one implementation, the above-noted components of the cooled electronic assembly, and in particular, the noted components of the cooling system, may be discrete components obtained, at least in part, as commercially available components. However, implementing the cooling system in this manner may add cost, space, and complexity to the cooling system, as well as to the resultant cooled electronic assembly. In accordance with aspects of the present invention, many of the above-noted structures or functions may be integrated (or combined) within a single, novel, multifunction coolant manifold structure.

For instance, in one embodiment, the multifunction coolant manifold structure may include or provide: a coolant reservoir; one or more coolant level sensors; a coolant expansion region; one or more vacuum breakers to prevent pump cavitation; one or more pressure-relief valves to ensure the cooling system does not over-pressurize; a distribution manifold to distribute coolant to the pumping assembly; a de-aerator facility to remove air and other gasses from the coolant within the cooling system; a coolant-commoning manifold to common exhaust coolant from multiple cooling structures; as well as a fill port for the cooling system. Advantageously, combining components of the cooling system into a single, multipurpose manifold structure saves cost, reduces space, and reduces complexity of the cooling system, as well as of the resultant cooled electronic assembly.

Figure 4:
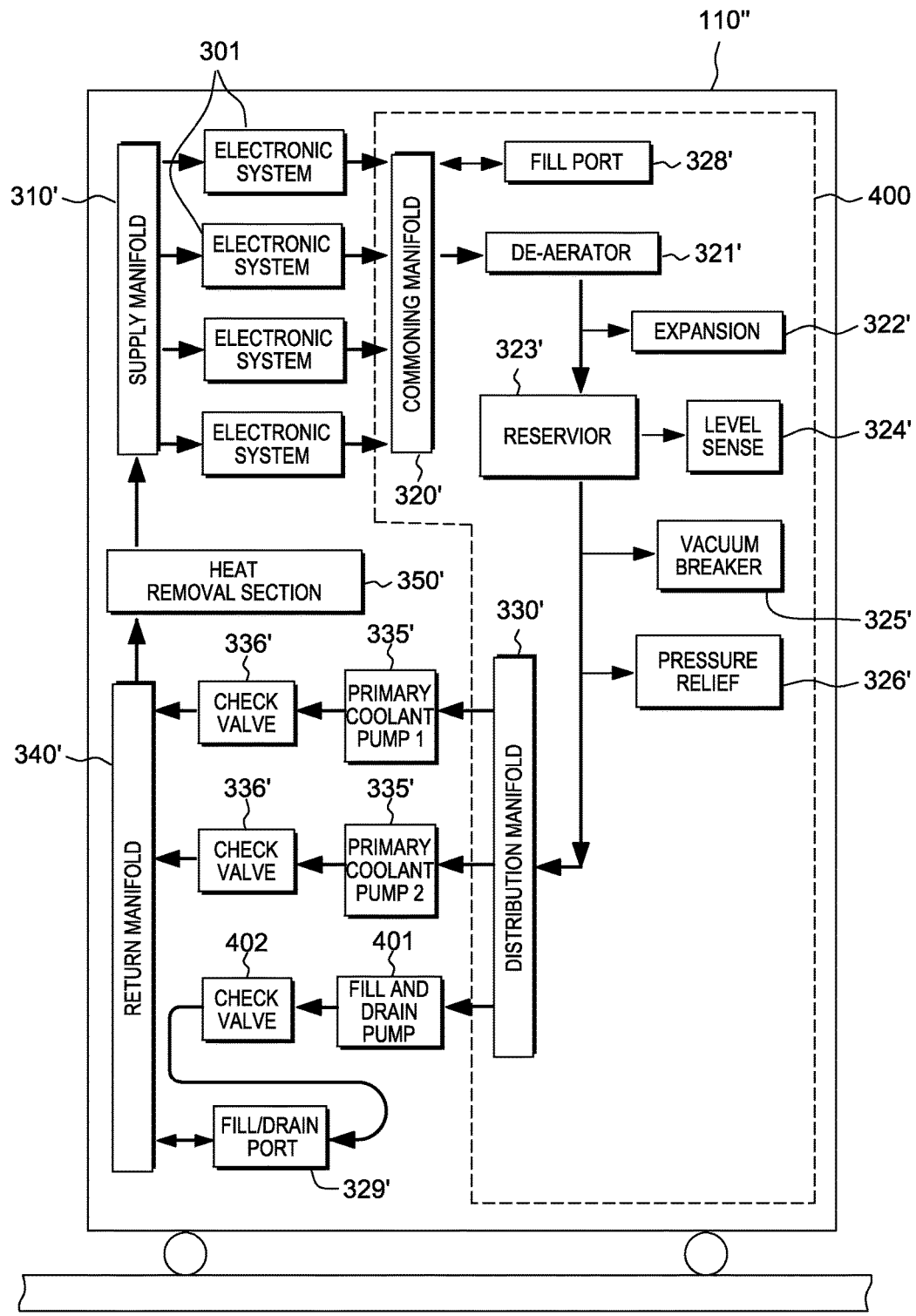
FIG. 4 is a schematic of another embodiment of a cooled electronics assembly having multiple electronic systems and a cooling system with, in part, an integrated fill and drain pump, in accordance with one or more aspects of the present invention.

FIG. 4 is a schematic depiction of one embodiment of a cooled electronic assembly configured as a cooled electronics rack 110", similar to the above-described cooled electronics rack 110' of FIG. 3. One significant difference in the assembly configuration of FIG. 4, however, is the provision of a multifunction coolant manifold structure 400, which integrates many of the functions and components described above in connection with the cooling system provided for the cooled electronic assembly of FIG. 3. In particular, as illustrated in FIG. 4, the multifunction coolant manifold structure 400 is shown to include, in one embodiment, a coolant-commoning manifold 320', a de-aerator facility 321', a coolant expansion region 322', a coolant reservoir 323', one or more coolant level sensors 324', one or more vacuum breakers 325', one or more pressure-relieve valves 326', a distribution manifold 330' for the pump assembly, as well as a fill port 328'. As described further below in connection with the embodiments of FIG. 5A-5B, these components are differently configured, however, and/or alternately implemented in comparison to the discrete components employed in the cooling system described above in connection with FIG. 3.

Another significant difference in the assembly configuration of FIG. 4 is the provision of a fill and drain pump 401 and associated check valve 402, integrated within the cooling system and coupled, for instance, in parallel with the primary coolant pump(s) 335'. As explained further below, integrating the fill and drain pump into the cooling system of the cooled electronic assembly provides numerous advantages, including, for instance, allowing the fill and drain pump to operate as a backup coolant pump to the primary coolant pump(s) upon detection of an error in the primary coolant pump(s) to ensure continued circulation of coolant through the coolant circulation loop of the cooling system. Further, integrating the fill and drain pump into the cooling system allows for the control system or controller of the cooling system to advantageously monitor one or more aspects of the cooling system during the selective coolant filling of the cooling system, or the coolant draining of the cooling system to, for instance, automatically deactivate the fill and drain pump, or provide a warning to service personnel performing the fill or drain process upon detection of a problem or error in the cooling system. By way of example, the one or more aspects or parameters being monitored by the control system may include one or more of coolant level within the cooling system, a current level being drawn by the fill and drain pump during the fill or drain operation, and/or a potential coolant leak from the cooling system.

Generally stated, disclosed herein are cooling systems, cooled electronic assemblies, and methods of fabrication, which include an integrated fill and drain pump. For instance, a cooling system for cooling one or more electronic components may include a coolant circulation loop, at least one primary coolant pump, and a fill and drain pump. The primary coolant pump(s) is coupled to facilitate circulating coolant through the coolant circulation loop, and the fill and drain pump is provided to facilitate selective filling of the cooling system with the coolant, or draining of the coolant from the cooling system. The fill and drain pump is integrated within the cooling system as a backup coolant pump to the at least one primary coolant pump, and the fill and drain pump circulates the coolant through the coolant circulation loop responsive to an error in the at least one primary coolant pump.

In one or more implementations, the primary coolant pump(s) comprises a first type of coolant pump, and the fill and drain pump comprises a second type of coolant pump, different from the first type of coolant pump. For instance, the first type of coolant pump may include or be a centrifugal-type pump or centripetal-type pump, and the second type of pump may be or include a positive displacement-type pump, or more generally, a self-priming-type coolant pump.

In certain implementations, the cooling system further includes a control system which controls the primary coolant pump(s) and the fill and drain pump. The control system automatically activates the fill and drain pump based on detection of the error in the primary coolant pump(s). Additionally, the control system monitors the cooling system during the selective filling of the cooling system with the coolant, and/or monitors the cooling system during the draining of the coolant from the cooling system. In one or more embodiments, the cooling system may include multiple primary coolant pumps coupled to the coolant circulation loop in parallel, and the control system automatically activates the fill and drain pump if an error is detected in each primary coolant pump of the multiple primary coolant pumps.

In another aspect, the cooling system further includes at least one coolant filter associated with the at least one primary coolant pump. The coolant filter(s) may be in or extend into a hose connecting the primary coolant pump(s) in fluid communication with the coolant circulation loop, for instance, at a coolant outlet, or downstream of the coolant outlet, of the primary coolant pump(s). Advantageously, the filter is sized to protect components of the cooling system from debris clogging, either, for instance, within channels of the cooling assemblies associated with the electronic systems, or, for instance, from interfering with quick connect couplings or the vacuum breaker seals.

As noted, in certain implementations, the cooling system includes a control system which automatically monitors the selective filling of, or the selective draining of, the cooling system, by monitoring one or more parameters or aspects of the cooling system during the coolant fill process or a coolant drain process, respectively, of the cooling system using, in part, the fill and drain pump. For instance, the one or more parameters may include one or more of coolant level within the cooling system, current being drawn by the fill and drain pump (indicative of whether coolant or air is passing through the pump), and/or coolant leakage from the cooling system. The control system may automatically issue a warning, or automatically deactivate the fill and drain pump upon detection of an issue with the one or more aspects of the cooling system being monitored during the coolant fill process or the coolant drain process.

In one or more embodiments, the cooling system may further include a heat exchange assembly coupled in fluid communication with the coolant circulation loop to dissipate heat from the coolant passing therethrough. The coolant circulation loop may include a coolant return manifold, or more specifically, a multifunction coolant manifold structure (such as disclosed herein), wherein the primary coolant pump(s) and the fill and drain pump are coupled in parallel-fluid communication between the multifunction coolant manifold structure and the heat exchange assembly. The multifunction coolant manifold structure may be combined with the above-noted implementations of the cooling system and include, in one embodiment, a coolant commoning manifold and an auxiliary coolant reservoir, which may be disposed above and in fluid communication with the coolant commoning manifold. The coolant commoning manifold is sized to slow flow of coolant exhausting from the multiple cooling assemblies to allow gas within the exhausting coolant to escape the coolant within the coolant commoning manifold. The multifunction coolant commoning manifold is configured for the escaping gas (e.g., air bubbles) to rise to the auxiliary coolant reservoir, and be replaced within the coolant commoning manifold by coolant from the auxiliary coolant reservoir.

In certain implementations, the multifunction coolant manifold structure is a single, integrated and rigid structure, where the auxiliary coolant reservoir is integrated with the coolant commoning manifold. In this configuration, the coolant commoning manifold may have a larger dimension in a first direction, such as the vertical direction, compared with that of the auxiliary coolant reservoir, which may have a larger dimension in a second direction, such as the horizontal direction. Thus, in one embodiment, the coolant commoning manifold may be an elongate, vertical manifold, and the auxiliary coolant reservoir may have a larger cross-sectional area in a horizontal direction to accommodate additional coolant.

In one or more other implementations, the auxiliary coolant reservoir may be coupled in fluid communication with the coolant commoning manifold via a detachable coolant conduit or hose. In this configuration, the coolant commoning manifold may have the same size as, or have a larger volume than, the auxiliary coolant reservoir. Alternatively, in one or more implementations, the auxiliary coolant reservoir may have a larger volume of coolant than the coolant commoning manifold. Also note that, in one or more embodiments, the coolant commoning manifold may have a coolant volume twice or larger the size of the coolant volume of the coolant supply manifold of the cooling system.

In one or more embodiments, the multifunction coolant manifold structure may include a detachable, field-replaceable unit, which includes the auxiliary coolant reservoir. Further, the field-replaceable unit may include one or more components for at least one of monitoring and controlling one or more characteristics of the coolant within the multifunction coolant manifold structure, and hence within the cooling system. By way of example, the one or more components may include one or more coolant level sensors (for sensing a level of coolant within the manifold structure); one or more vacuum breakers (to prevent cavitation within the pumping assembly of the cooling system); and/or one or more pressure relief valves (to ensure that the cooling system does not over-pressurize), etc. Advantageously, by associating these components with a field-replaceable unit, the one or more components may be readily removed for servicing or replacement by exchanging out the field-replaceable unit of the multifunction coolant manifold structure. Further, by sizing the coolant commoning manifold as discussed herein, and by locating the field-replaceable unit above the coolant commoning manifold, the field-replaceable unit may be replaced while the cooling system is operational, that is, while coolant continues to be pumped through the cooling system to cool the electronic systems. This can be accomplished, in part, by utilizing quick disconnect couplings in association with the detachable coolant conduit coupling the auxiliary coolant reservoir to the coolant commoning manifold.

Figure 5A:
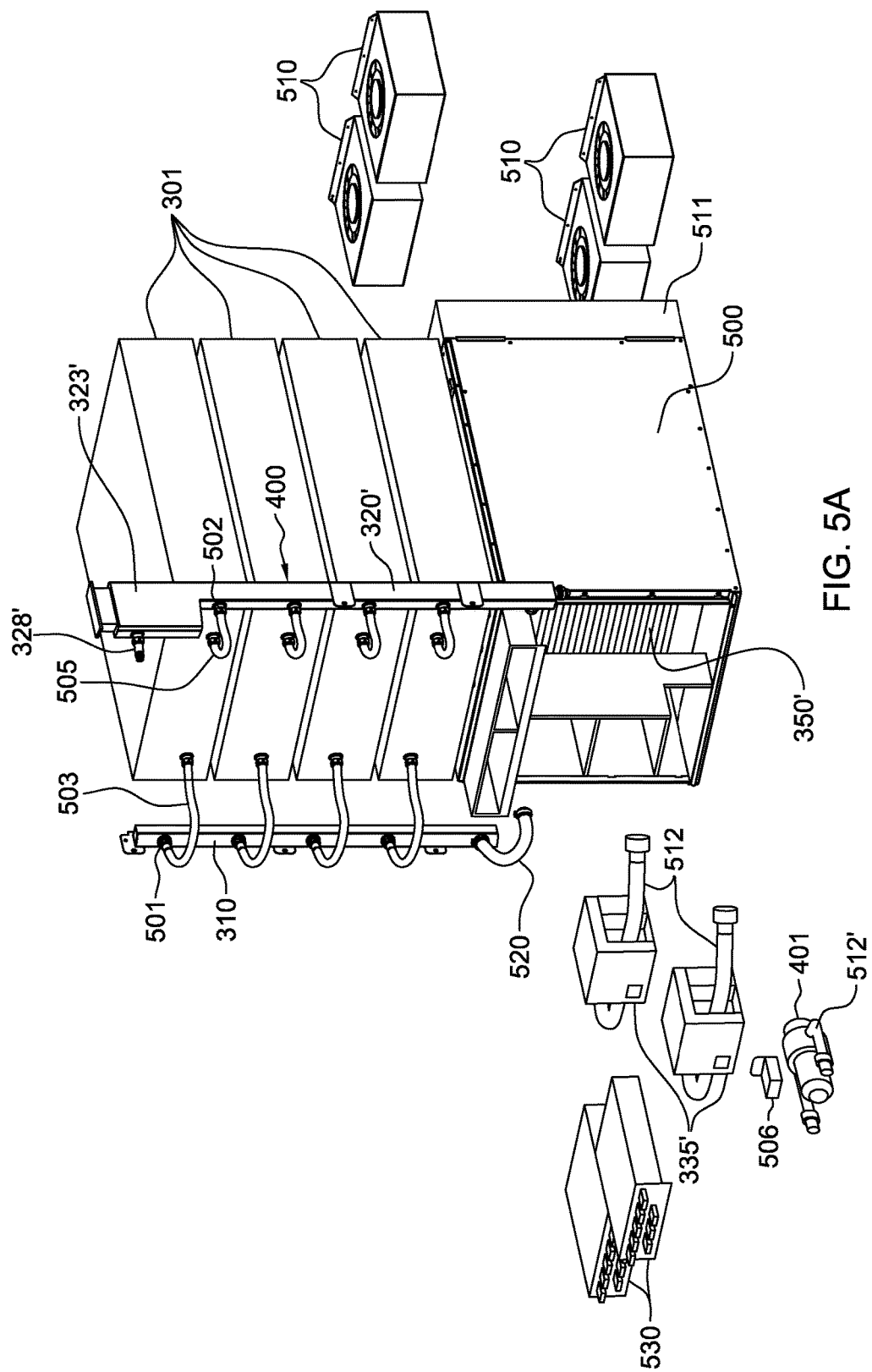
FIG. 5A depicts one detailed embodiment of a partially-assembled, cooled electronic assembly comprising multiple electronic systems and a cooling system, in accordance with one or more aspects of the present invention.
Figure 5B:
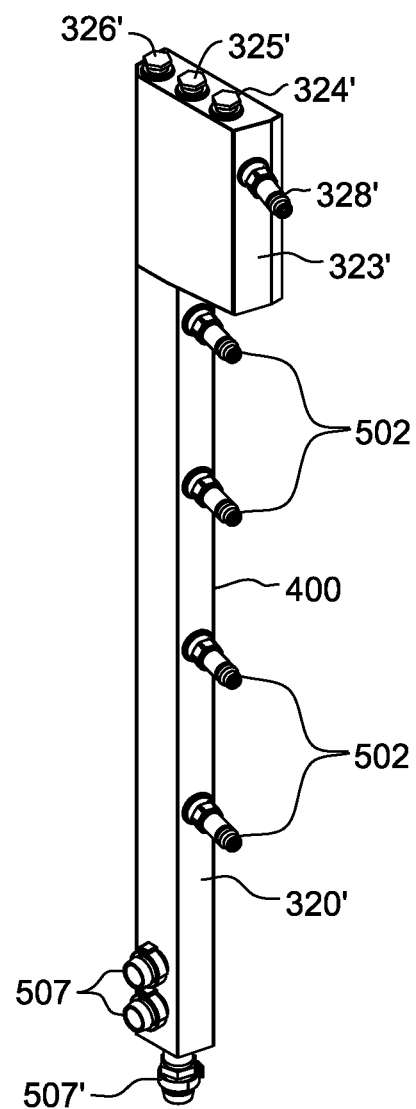
FIG. 5B is an enlarged depiction of one embodiment of the multifunction coolant manifold structure of the cooling system of FIG. 5A, in accordance with one or more aspects of the present invention.

By way of example, FIGS. 5A & 5B depict one detailed embodiment of a partially assembled, cooled electronic assembly, in accordance with one or more aspects of the present invention. In the depicted embodiment, the cooled electronic assembly includes a cooling system housing 500, which may be configured for disposition within, for instance, a lower portion of an electronics rack, such as within one or more of the above-described electronics racks. As illustrated, the cooled electronic assembly also includes multiple electronic systems 301 to be cooled. In the configuration of FIG. 5A, the electronic systems are shown one above the other, above cooling system housing 500, as they might be positioned within an electronics rack. Note, however, that this particular configuration is presented as one example only. Electronic systems 301 each have associated therewith a cooling assembly (not shown), such as one or more coolant-cooled heat sinks, cold plates, immersion-cooling housings, etc., which facilitate extraction of heat from the respective electronic system, or from one or more electronic components within the respective electronic system.

As illustrated in FIG. 5A, the coolant circulation loop of the cooling system includes, in the depicted embodiment, a coolant supply manifold 310, which includes respective quick connect couplings 501 that facilitate connection of appropriately sized and configured hoses 503 to the coolant supply manifold 310, so as to couple in fluid communication the coolant supply manifold and the cooling assemblies associated with the electronic systems 301. Similar hoses 505 and quick connect couplings 502 are associated with the multifunction coolant manifold structure 400 of the cooling system's coolant circulation loop for coupling the cooling assemblies associated with the electronics systems 301 in parallel fluid communication with manifold structure 400 as well.

As illustrated in FIG. 5A, the multifunction coolant manifold structure includes a coolant-commoning manifold 320' from which quick connect couplings 502 extend. In one embodiment, coolant-commoning manifold 320' is sized larger than coolant supply manifold 310 (e.g., 2× larger or greater in coolant volume) to, in part, slow a flow rate of coolant exhausting from the cooling assemblies associated with the electronic systems 301 as the coolant enters the coolant-commoning manifold 320'. This slowing of the coolant flow rate is designed so that entrained air or gas within the coolant is allowed to escape within the coolant-commoning manifold 320' and rise, in one embodiment, to auxiliary coolant reservoir 323' located above coolant-commoning manifold 320', and in fluid communication therewith.

In the example of FIGS. 5A & 5B, the multifunction coolant manifold structure 400 is a single, integrated and rigid structure, with the coolant-commoning manifold 320' and auxiliary coolant reservoir 323' in fluid communication within the integrated structure. As escaping air or gas rises to the auxiliary coolant reservoir 323' from the coolant-commoning manifold 320', it is replaced within the coolant-commoning manifold 320' by coolant from the auxiliary coolant reservoir 323'. That is, as air or gas rises, coolant drops from the auxiliary coolant reservoir 323' into the coolant-commoning manifold 320'. In this manner, the multifunction coolant manifold structure 400 inherently functions as a de-aerator. Further, a coolant expansion region is defined in an upper portion of auxiliary coolant reservoir 323' by providing, for instance, a coolant fill port 328' in association with the auxiliary coolant reservoir on a side of the reservoir, spaced below an upper-most (or top) of the auxiliary coolant reservoir 323'. In this manner, a volume of air (that is, an air pocket) is formed above the coolant fill port 328' within the auxiliary coolant reservoir. This volume of air advantageously allows for safe expansion and contraction of the coolant within the cooling system due, for instance, to changing temperatures or pressures.

As illustrated in FIGS. 5A & 5B, the multifunction coolant manifold structure 400, and in particular, the auxiliary coolant reservoir 323' portion thereof, includes connections for one or more components to at least one of monitor or control one or more characteristics of the coolant within the multifunction coolant manifold structure. These one or more components may include, for instance, one or more upper and lower coolant level sensors 324' for sensing level of coolant within the multifunction coolant manifold structure 400, and reporting the level to a control system or controller (not shown) for use in possible control action. For instance, should the level of coolant within the multifunction coolant manifold structure drop to an unacceptably low level, the level sensor(s) 324' signals could be employed by the controller to signal service personnel to add coolant to the system. Alternatively, depending on the sensed level, the controller could automatically shut the cooling system down, and depending on the implementation, possibly shut the electronic systems down as well. This might depend, for instance, on whether backup cooling, such as backup airflow cooling, is integrated within the cooled electronic assembly. Additionally, the component connections may allow for connections of one or more vacuum breakers 325', and/or one or more pressure-relief valves 326', as described above.

Note that FIGS. 5A & 5B depict one embodiment only of an multifunction coolant manifold structure 400, configured as an integrated structure, wherein the above-described components or facilities are advantageously integrated into a common, multipurpose structure. By way of example, the multifunction coolant manifold structure may be fabricated of a single, punched, stainless steel sheet metal stamping, which is bent into the appropriate shape and robotically welded to arrive at the desired structure. The illustrated manifold structure 400 is used to common the exhaust flow from the parallel-coupled cooling structures associated with the electronic systems. In one implementation, these could be parallel computer nodes or server nodes of an electronics rack, with four electronic systems being illustrated in FIGS. 5A & 5B, by way of example only.

As noted, the upper portion of the multifunction coolant manifold structure is advantageously configured as an auxiliary coolant reservoir. In one or more implementations, the cross-sectional area of the auxiliary coolant reservoir 323' is larger than the cross-sectional area of the coolant-commoning manifold 320'. In particular, in the depicted implementation, the coolant-commoning manifold 320' has a larger dimension in a first, vertical direction compared with that of the auxiliary coolant reservoir 323', but that the auxiliary coolant reservoir 323' has a larger horizontal dimension in a second direction compared with that of the coolant-commoning manifold 320'. Note that the specific configuration of auxiliary coolant reservoir 323' is presented by way of example only. The size and configuration of the multifunction coolant manifold structure may depend, in part, on the available size within the associated electronics assembly or electronics rack to which the cooling system provides cooling.

Note also that, in one embodiment, the coolant-commoning manifold 320' cross-section is made larger than normally required to carry the coolant flow (for instance, 2× or larger) in order to allow the returning, exhausting coolant to slow down, allowing air and other gas in the coolant to de-aerate, or come out of solution, within the coolant-commoning manifold, with any gas bubbles rising to the auxiliary coolant reservoir portion at the top of the manifold structure, while coolant from the reservoir replaces the gas bubbles from the coolant-commoning manifold. Note that the multifunction coolant manifold structure further may incorporate, for example, in association with the auxiliary coolant reservoir, one or more level sensors, to allow the cooling system controller to know the current coolant level state, and take or signal for action, if required.

Additionally, features or connections may be provided in the multifunction coolant manifold structure, such as, in association with the auxiliary coolant reservoir (in one embodiment), to facilitate installing vacuum breakers 325' and/or pressure-relief devices 326'. The vacuum breaker(s) ensures that the auxiliary coolant reservoir is near atomospheric or slightly negative pressure. This feature may be employed to prevent the pumps from cavitating due to a negative pressure in the system. The pressure-relief valves may be provided as a safety feature. These devices and valves are placed, in one embodiment, in the auxiliary coolant reservoir, at the highest coolant location within the cooling system. This ensures that, even if the devices fail in an open state, no coolant will escape since the coolant is under little or no pressure within the multifunction coolant manifold structure. During normal operation, the devices can fail in place, and not cause any functional problems with the cooling system disclosed herein. The component(s) can also be safely removed while the cooling system is operational. Note that in the embodiment of FIGS. 5A & 5B, the vacuum breaker devices 325' and pressure-relief valves 326' are located in the upper-most portion of the auxiliary coolant reservoir 323'.

Mounting brackets may be provided to facilitate convenient mounting of the coolant supply manifold and multifunction coolant manifold structure into the electronics rack or frame. In one implementation, the multifunction coolant manifold structure is filled with coolant, as is the rest of the cooling system, prior to starting the pumping assembly. The reservoir 323' is, in one implementation, sized with a sufficient volume of coolant to ensure that if an unfilled cooling structure associated with one of the electronics systems is connected to the cooling system during operation, there will be sufficient coolant within the cooling system to continue operation. Note that in the embodiment presented, a large volume of coolant exists above the multiple parallel-coupled pumps, ensuring a good source of coolant to prime the pumping units.

As shown in the figures, the multifunction coolant manifold structure 400 further includes a coolant distribution manifold portion with coolant distribution connections 507, 507' (FIG. 5B), which allow coolant hoses 512, 512' (FIG. 5A) to couple to the manifold structure to receive coolant from the multifunction coolant manifold structure 400 for distribution to the multiple pumping units, such as the above-described primary coolant pumps 335', and fill and drain pump 401. In the embodiment of FIG. 5A, two primary coolant pumps 335', or redundant pumping units (RPUs), are illustrated by way of example only, each receiving coolant (via the respective hose connection 507 and hose 512) when active from the multifunction coolant manifold structure 400. In one implementation, the parallel-coupled primary coolant pumps 335' operate to independently pump coolant through a return manifold (not shown) to a heat removal section 350' (as described above), which may also be disposed within the cooling system housing 500, for instance, behind the primary coolant pumps 335'. In one implementation, the heat removal section 350' may comprise one or more coolant-to-air heat exchangers, with air being drawn through the cooling system housing 500 via one or more fan mechanisms 510, which in one embodiment, may also be disposed within the housing 500, for instance, behind the one or more coolant-to-air heat exchangers. In the depicted embodiment, a common air plenum 511 may be defined between the fan mechanisms 510 to facilitate balanced airflow through the cooling system housing 500, and thus across the heat removal section 350'. In one or more implementations, the fan mechanism 510 may comprise centrifugal fans or blowers, with four fan mechanisms being depicted in the embodiment of FIG. 5A, by way of example only. Note that in an alternate embodiment, the heat removal section 350' could include one or more liquid-to-liquid heat exchangers to reject heat from the coolant circulating through the cooling system to, for instance, facility-chilled liquid, such as building-chilled water. The heat removal section is coupled to coolant supply manifold 310 via a hose 520 and appropriate connections.

As noted, in another aspect of the cooling system and cooled electronic assemblies disclosed herein, a fill and drain pump 401 is integrated within the cooling system and disposed, for instance, within cooling system housing 500. In one or more implementations, fill and drain pump 401 is integrated within the cooling system for use during a coolant fill process or a coolant drain process, as well as to operate as a backup coolant pump to the one or more primary coolant pumps. For instance, should an error condition be detected in the primary coolant pump(s) 335', then the control system of the cooling system may be configured or programmed to automatically activate the fill and drain pump to continue circulating coolant through the coolant circulation loop in a failsafe mode until service personnel may service the cooling system.

By way of example, the primary coolant pumps 335' may each be or comprise a centrifugal-type pump or centripetal-type pump, and the fill and drain pump 401 may be, for instance, a positive displacement-type pump. Coolant hoses 512' coupled to fill and drain pump 401 may include quick connect couplings to allow for the different uses of the fill and drain pump described herein, that is, to facilitate a coolant fill process, a coolant drain process, as well as to allow for the fill and drain pump 401 to be coupled as a failsafe pump in parallel-fluid communication with the primary coolant pumps 335' when the cooled electronic assembly is in normal operation. For instance, in normal operation, the fill and drain pump 401 is coupled in parallel-fluid communication with primary coolant pumps 335' between multifunction coolant manifold structure 400 and the return manifold at the inlet to heat removal section 350'. In addition, as illustrated in FIG. 5A, one or more leak sensor(s) 506 may be provided within the cooling system associated with, for instance, one or more system coolant pans located below the cooling system, in a lower portion of the cooled electronic assembly. The leak sensor(s) 507 may be coupled to a control system or controller, described below, which monitors for potential coolant leakage within the system and initiates in response thereto one or more automatic processes.

Note that in the implementation depicted, multiple drive cards 530 are employed, by way of example. Drive cards 530 power and control operation of, for instance, the primary coolant pumps 335', the fill and drain pump 401, as well as the fan mechanisms 510, as directed, for instance, by the control system of the cooling system.

Figure 6:
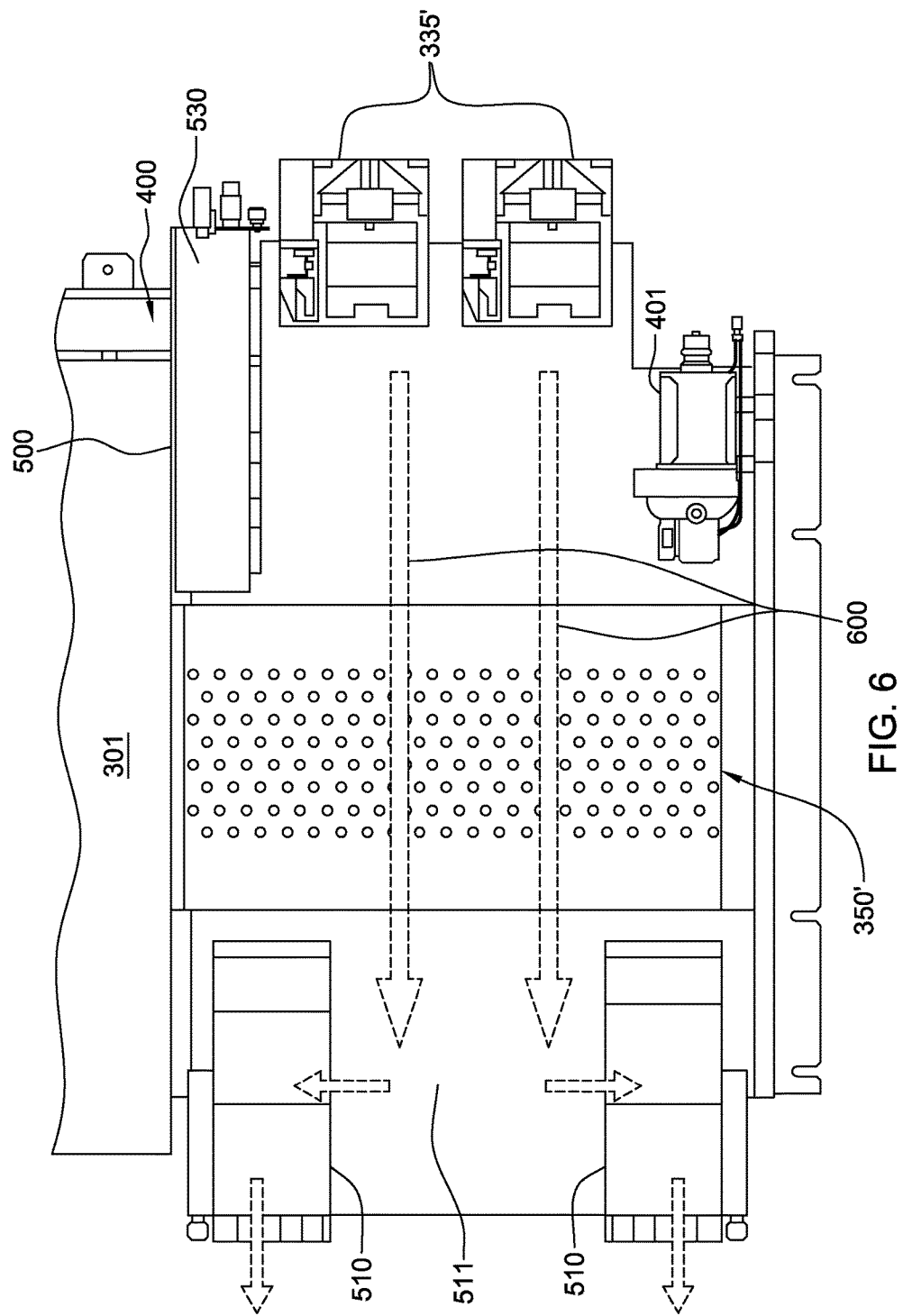
FIG. 6 is a partial cross-sectional elevational view of the cooled electronic assembly of FIG. 5A, in accordance with one or more aspects of the present invention.

FIG. 6 is a partial cross-sectional elevational view of the cooling system of FIG. 5A, shown in operation, and illustrating a cooling airflow 600 being drawn across a coolant-to-air heat exchanger within the heat removal section of the cooling system. Cooling airflow 600 may be drawn from an air inlet side to an air outlet side of the cooled electronic assembly employing multiple fan mechanisms 510, such as multiple centrifugal fans, which may draw air from common airflow plenum 511 near or at the air outlet side of the cooled electronic assembly.

Figure 7:
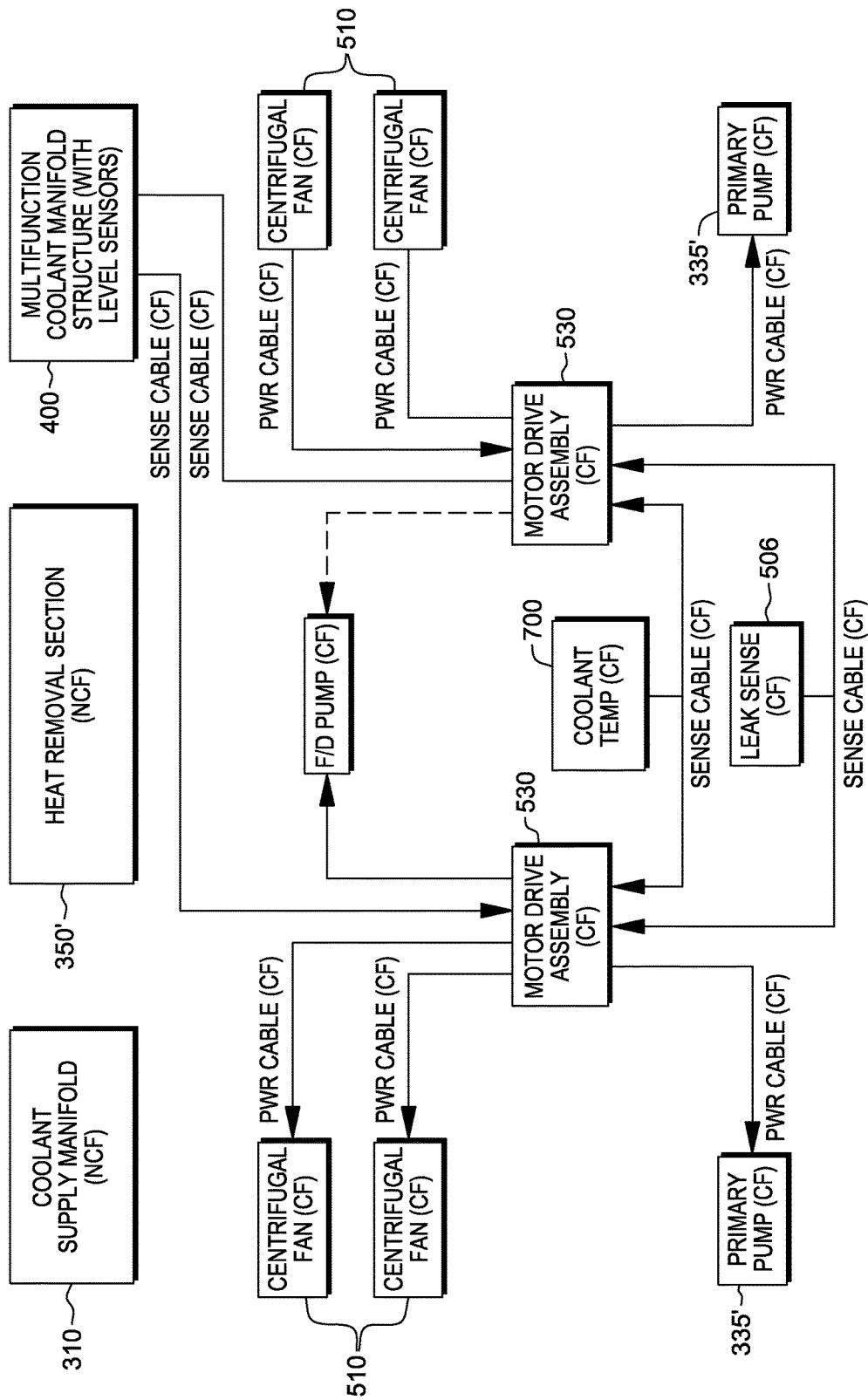
FIG. 7 is a further block diagram depiction of the cooled electronic assembly of FIG. 5A, illustrating components of the cooling system which are (in one embodiment) concurrently field-replaceable (CF), as well as components which are non-concurrently field-replaceable (NCF), in accordance with one or more aspects of the present invention.

FIG. 7 is a schematic of the cooling system described above in connection with FIGS. 5A-6, wherein various components of the cooling system are designated as either concurrently field-replaceable units (CF) or non-concurrently field-replaceable units (NCF). As illustrated, in one embodiment, the primary coolant pumps 335', centrifugal fans 510, motor drive assemblies (MDA) 530, fill and drain pump 401, leak sensor(s) 506, coolant temperature sensor(s) 700, and various sense and power cables to motor drive assemblies 530, may each be concurrently field-replaceable units in a cooling systems such as described herein. For instance, while one motor drive assembly 530 is driving one primary coolant pump 335' and two centrifugal fans 510, the remaining concurrently field-replaceable motor drive assembly, primary coolant pump fill and drain (F/D) pump and centrifugal fans may be replaced. In the depicted embodiment, only supply manifold 310, heat removal section 350', and multifunction coolant manifold structure 400, are non-concurrently field-replaceable units. Note that the level sensors associated with multifunction coolant manifold structure 400 may be provided as redundant sensors. For instance, there may be redundant upper coolant level sensors, as well as redundant lower coolant level sensors. In one or more implementations, the control system oversees the operation of the cooling system by receiving sensed parameters, as well as by activating or deactivating, for instance, one or more of primary coolant pumps 335', motor drive assemblies 530, fill and drain pump 401, and centrifugal fans 510, based, for instance, on whether a coolant fill process, a coolant drain process, or normal operational mode, are in effect as explained further below.

Figure 8A:
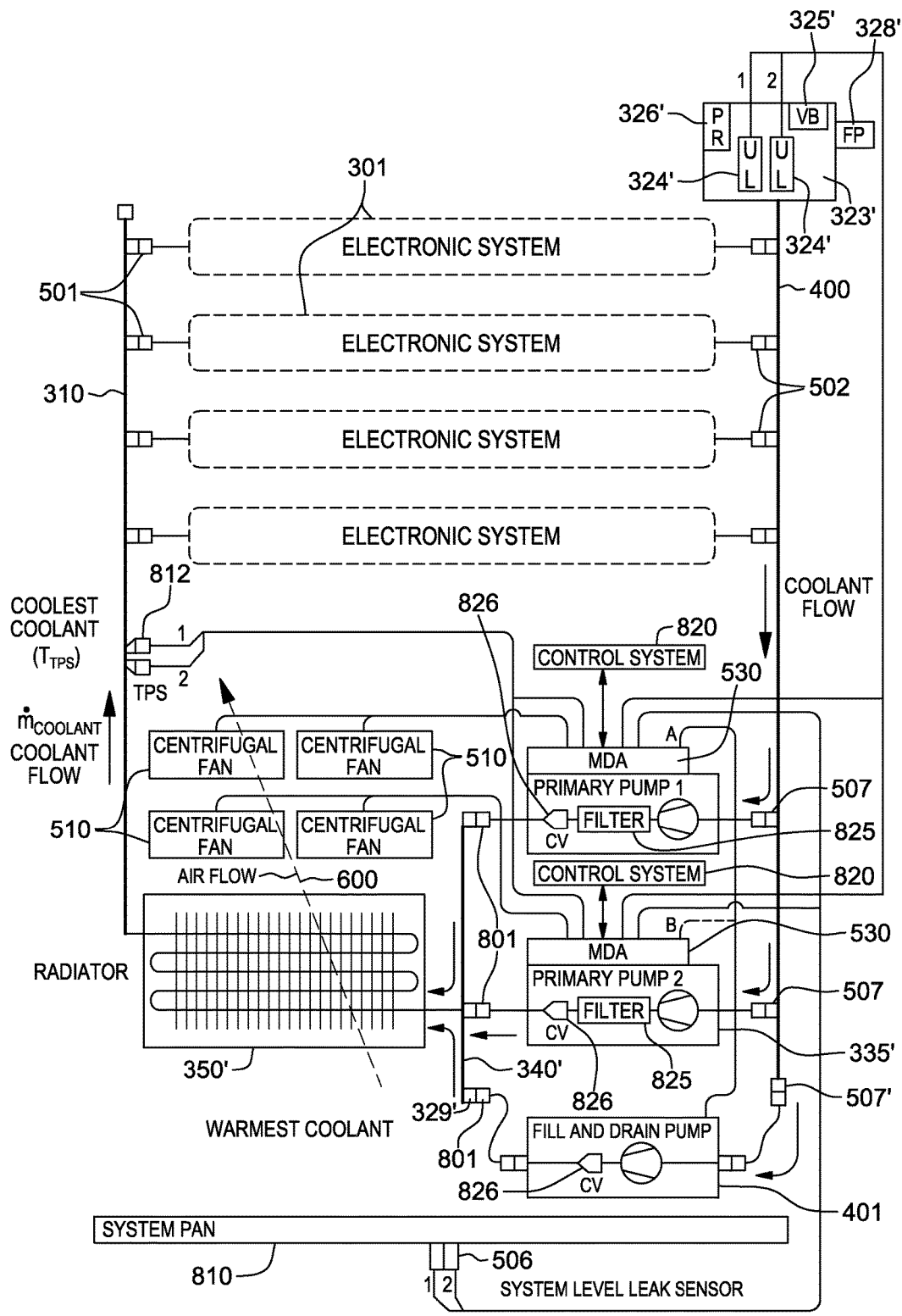
FIG. 8A is an operational schematic of one embodiment of the cooled electronic assembly of FIG. 5A, in accordance with one or more aspects of the present invention.

FIG. 8A is an operational schematic of one embodiment of the cooled electronic assembly of FIGS. 5A & 6, in accordance with one or more aspects of the present invention. As illustrated, the cooled electronic system includes multiple electronic systems 301, each of which may have, in one embodiment, an associated cooling assembly of a cooling system, such as described herein. As noted, in one or more embodiments, the cooling assemblies may comprise one or more coolant-cooled heat sinks, cold plates, immersion-cooling housings, etc., which facilitate extraction of heat from the respective electronics system, or from one or more electronic components within the respective electronics system. As illustrated, the cooling assemblies associated with the electronic systems 301 may be coupled in parallel-fluid communication between coolant supply manifold 310 and a coolant return manifold, such as the above-described multifunction coolant manifold structure 400. The cooling system's coolant circulation loop further includes, in one example, redundant primary coolant pumps 335' coupled in parallel-fluid communication between multifunction coolant manifold structure 400 and a return or commoning manifold 340' at the inlet to heat removal section 350'. By way of example, heat removal section 350' may include one or more coolant-to-air heat exchangers, and multiple associated fan mechanisms 510 (e.g., centrifugal fans) may be provided to draw an airflow 600 across the heat removal section, transferring heat from the circulating coolant within the cooling system to the airflow 600 passing across heat removal section 350'. The cooled coolant is then returned to the coolant supply manifold 310 to continue circulation within the coolant circulation loop. As noted above, the heat removal section 350' could comprise, in another embodiment, one or more coolant-to-coolant heat exchangers or liquid-to-liquid heat exchangers to reject heat from the coolant circulating through the coolant circulation loop of the cooling system to a facility coolant. For instance, heat could be rejected to facility-chilled water where available, rather than to cooled air 600. Quick connect couplings 501, 502, 507, 507', 801 may be used within the cooling system to facilitate coupling and decoupling of the various components of the coolant circulation loop of the cooling system, as illustrated.

As explained above, the multifunction coolant manifold structure 400 may include a reservoir 323' in an upper portion thereof, which includes, for instance, a coolant fill port 328', redundant upper and lower coolant level sensors 324', one or more vacuum breakers 325', and one or more pressure-relief valves 326'. The level sensors provide signals, in one embodiment, to redundant motor drive assemblies 530 controlled by control system 820 of the cooling system. As illustrated, in one embodiment, each motor drive assembly 530 is associated with a respective primary coolant pump 335'. In addition to monitoring the level sensors, the motor drive assemblies 530 also monitor, in one embodiment, system level leak sensors 811 associated, for instance, with a system leak pan 810 disposed in a lower portion of the cooled electronic assembly, as well as monitor redundant temperature sensors 812 associated with the coolant supply manifold 310 to monitor temperature of the cooled coolant being returned to the cooling assemblies associated with electronic systems 301. Control system 820, which may be resident within the cooled electronic assembly or rack, or located elsewhere within a data center comprising the cooled electronic assembly, controls operation of the motor drive assemblies 530, for instance, in accordance with a configured or programmed process, such as described below in connection with FIG. 8B.

Figure 8B:
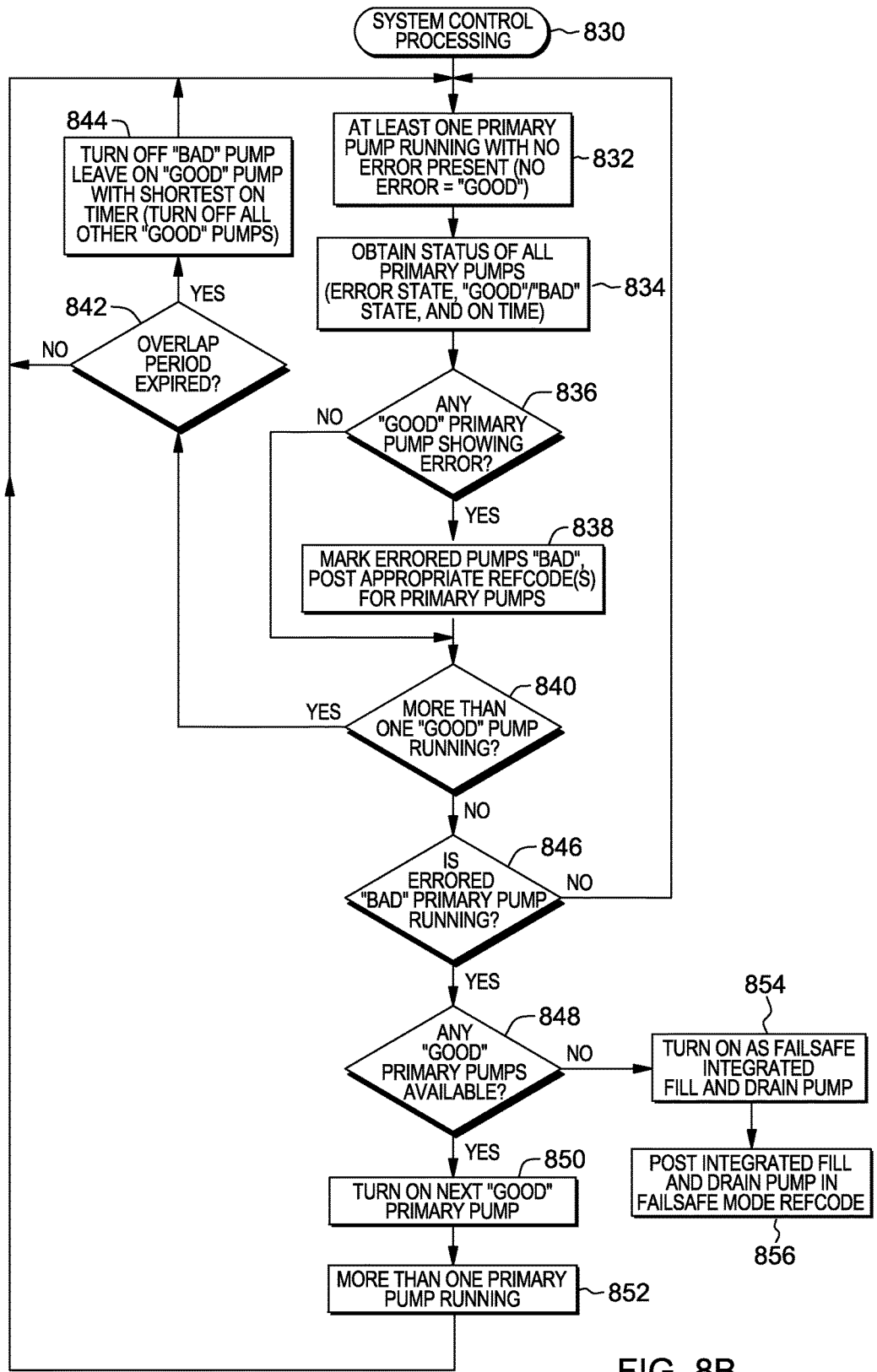
FIG. 8B depicts one embodiment of a control system process for, in part, activating the fill and drain pump as a backup coolant pump to circulate coolant through the coolant circulation loop responsive to an error in the primary coolant pump(s), in accordance with one or more aspects of the present invention.

Before describing the control system process embodiment of FIG. 8B, note that the primary coolant pumps 335' may be identical, off-the-shelf, AC driven, centrifugal or centripetal pumps. At the inlet and outlet side of primary coolant pumps 335', hoses, such as formed hoses, may be provided to facilitate coupling the respective pump to the multifunction coolant manifold structure 400 and the return or commoning manifold 340' at the supply side to heat removal section 350'. Additionally, as illustrated, each primary coolant pump 335' may include a coolant filter 825, for instance, disposed at the coolant outlet, or downstream of the coolant outlet, of the respective pump unit, as well as a check valve 831, to prevent backflow of coolant when the respective primary coolant pump is inactive. Note that coolant filters 825 may be, in one or more embodiments, non-replaceable filters configured to trap debris, for instance, caused by failure of the associated primary coolant pump unit. In one or more embodiments, each motor drive assembly 530 is associated with a respective primary coolant pump 335' and is able to power and control the associated primary coolant pump, as well as the fill and drain pump 401, and one or two fan mechanisms 530, such as centrifugal fans 510. Additionally, as noted, each motor drive assembly 530 reads the leak sensors 506 located in the system pans 810 under the heat removal section 350', and under the coolant pumps, as well as the level sensors 324' in the auxiliary reservoir 323', and a thermistor reading 812, reading the coolant temperature being supplied to the electronic systems or processor drawers. In addition, each motor drive assembly may incorporate an air inlet temperature sensor (not shown). In one embodiment, control system 820 is configured or programmed to control the state of the motor drive assemblies 530.

As explained above, in operational state, a fill and drain pump 401 is also provided in parallel-fluid communication with the primary coolant pumps 335', between the multifunction coolant manifold structure 400 and the return or commoning manifold 340' at the inlet to the heat removal section 350'. By way of example, quick connect couplings 507, 507', 801 and respective hoses may be used to couple the fill and drain pump 401 in parallel-fluid communication with the primary coolant pump(s) 335', as shown in FIG. 8A. As noted, in one embodiment, fill and drain pump 401 may include a check valve 826 at the coolant outlet thereof, as well as an in-line coolant filter (not shown), such as the above-described coolant filters 825 associated with the primary coolant pumps 335'. In the example depicted, fill and drain pump 401 is coupled in fluid communication to fill/drain pump 329' via a respective quick connect coupling 801.

Advantageously, by integrating the fill and drain pump 401 within the cooled electronic assembly, control system 820 of the cooling system may provide additional control and monitoring. For instance, control system 820 may monitor for errors in primary coolant pumps 335' which would require deactivation of the primary coolant pumps, and in such a case, automatically activate fill and drain pump 401 in a failsafe mode to provide backup coolant flow through the cooling system, possibly at a lower flow rate than the flow rate of coolant provided by primary coolant pump(s) 335'. This will depend on the type of fill and drain pump employed. By employing the fill and drain pump as a backup pump in a coolant flow schematic such as depicted in FIG. 8A, minimal, if any, frequency degradation for smaller electronic systems may be encountered upon loss of the primary coolant pumps. The fill and drain pump 401 will provide additional time to allow service personnel to service the primary coolant pump(s) while still allowing continued operation of the cooled electronic assembly. Further, in one or more implementations, a single primary coolant pump may be used in parallel with a fill and drain pump such as described herein, eliminating the need for redundant primary coolant pumps.

FIG. 8B depicts one embodiment of system control processing 830 implemented by control system 820 of a cooled electronic assembly, such as disclosed herein. In the depicted processing embodiment, the control system or controller determines whether at least one primary coolant pump is running with no error present, where a no error state means that the primary coolant pump is "good" 832. The control system obtains status for each primary coolant pump. The status includes the state of the primary coolant pump, that is, whether in a "good" or "bad" state, and on time 834. The associated motor drive assembly 530 (FIG. 8A) of the primary coolant pump 335' (FIG. 8A) may identify various types of errors including, for instance, coolant pump over and/or under current, coolant pump over and/or under rotating, fan mechanism faults, leak detected, dry auxiliary coolant reservoir, that is, both level sensors dry, a voltage test point error(s), or a non-valid temperature sensor.

Processing inquires whether any "good" primary coolant pump is now showing an error state 836, and if "yes", the control system marks the errored primary coolant pump as "bad", and posts an appropriate reference code for the primary coolant pump 838. If no "good" primary coolant pump is showing error, or if so, after the primary coolant pump has been marked "bad", the control system determines whether one "good" primary coolant pump remains running 840. If "yes", then processing determines whether an overlap period has expired 842. Note that the overlap period is selected to allow any recently turned on primary coolant pump to speed up and potentially reveal any defects before the previously "bad" state or "good" state primary coolant unit is turned off. This ensures that the next primary coolant pump to operate is functioning well before the present primary coolant pump is turned off. By way of example, an overlap period on the order of ten minutes may be sufficient for this purpose. Note that in one or more embodiments, the control system may perform periodic switch-over processing, where a next "good" primary coolant pump is turned on after the switch-over period has expired, for instance, after a certain number of hours of running. If the overlap period has not expired, processing returns to determine whether at least one primary coolant pump is running with no error present 832. Otherwise, the "bad" primary coolant pump is turned off, with the "good" primary coolant pump remaining running, having the shortest "on" timer, that is, any other "good" primary coolant pump(s), in the case of more than two primary coolant pumps, are turned off 844, before processing repeats.

Assuming that more than one "good" primary coolant pump is not currently running 840, then processing determines whether the errored "bad" primary coolant pump is running 846. If "no", then no action is taken and processing repeats. If "yes", then the control system determines whether any "good" primary coolant pumps are available 848. If "yes", a next "good" primary coolant pump is activated 850, meaning that more than one primary coolant pump is currently running 852, and processing returns to determine whether at least one primary coolant pump running has no error present 832.

If no "good" primary coolant pumps are available, then the control system turns on or activates the failsafe, integrated fill and drain pump 854, and posts an integrated fill and drain pump in failsafe reference code 856. This reference code may trigger one or more service processes, such as a service process to be performed by a service technician to repair/service the error states, such as turning off marked "bad" parts and allow their replacement, after which service processes may clear the errors and restore the affected parts to "good" state.

Advantageously, integrating the fill and drain pump within the cooled electronic assembly such as described herein allows for monitoring by the control system of the cooling system during a coolant fill process or a coolant drain process. For instance, during a coolant fill process or coolant drain process, the control system may monitor coolant levels via the level sensors, as well as one or more pump characteristics, such as one or more characteristics of the fill and drain pump, or one or more characteristics of the primary coolant pump(s). In addition, the control system may be used to monitor coolant top-offs and/or filling of one or more field-replaceable units exchanged into the cooling system.

Figure 9:
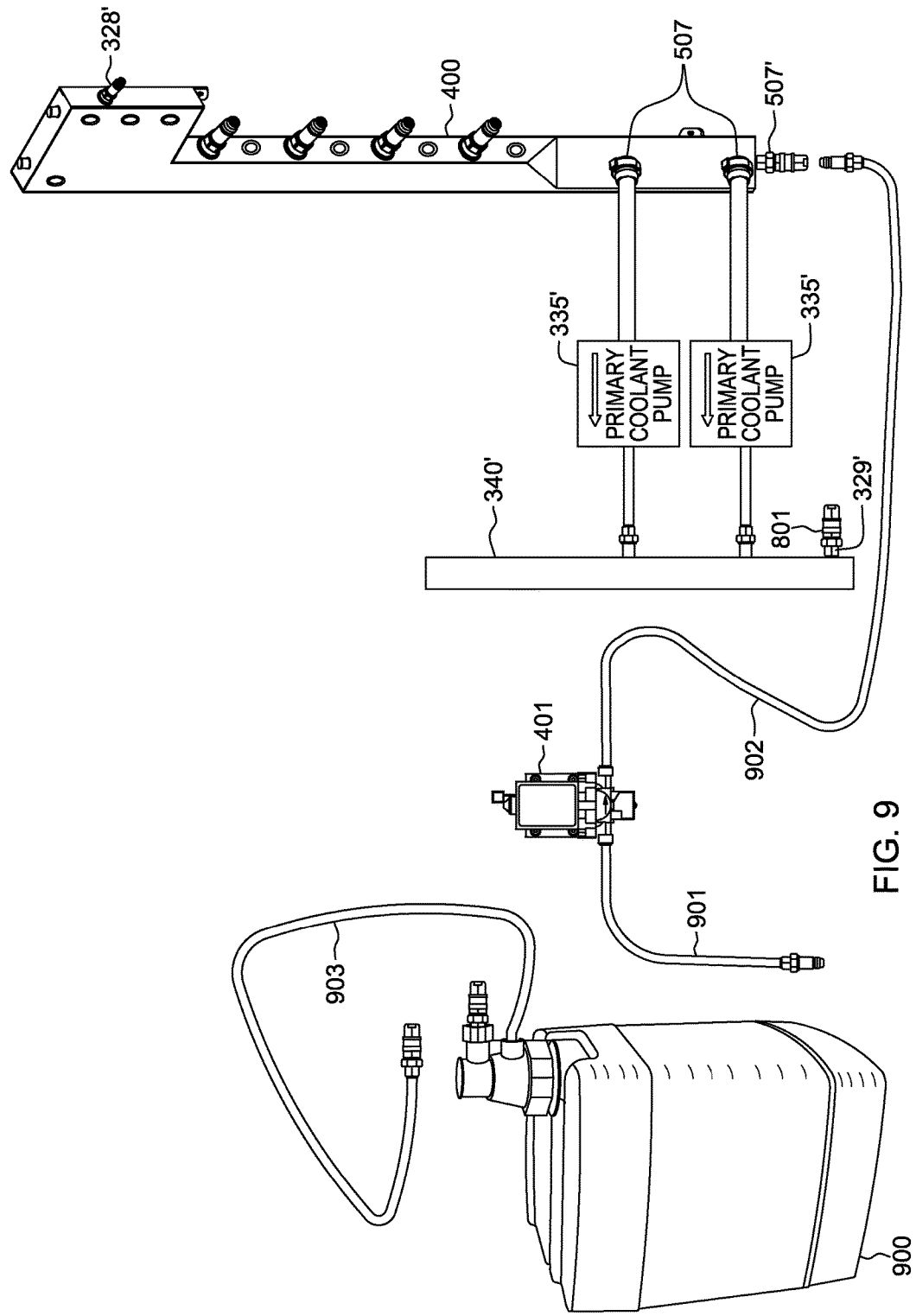
FIG. 9 is a partial depiction of the cooled electronic assembly of FIG. 5A, and a fill/drain container to be used in a coolant fill process or coolant drain process, in accordance with one or more aspects of the present invention.

FIG. 9 is a partial depiction of a cooled electronic assembly such as described above in connection with FIGS. 5A, 6 & 8A, as well as a container 900 for containing liquid coolant to be provided to, or drained from, the cooled electronic assembly. As illustrated, in one or more embodiments, redundant primary coolant pumps 335' may be coupled in parallel-fluid communication between multifunction coolant manifold structure 400 such as described herein (or more generally, a coolant return manifold), and a commoning manifold 340' at the coolant inlet side to the heat removal section, such as the above-described heat exchanger(s). As noted, in one embodiment, multifunction coolant manifold structure 400 includes a quick connect coupling 507' to the manifold, and a fill/drain port 328' in the auxiliary coolant reservoir, disposed in the uppermost portion of the manifold. Further, a quick connect coupling 801 is provided in commoning manifold 340' which is, in one or more embodiments, disposed at a lowest point in the cooling system (i.e., at the above-described fill/drain port 329'). Hoses 901 and 902 of appropriate diameter and length are coupled to the fill and drain pump 401, which as noted above, is integrated within the cooled electronic assembly. Coolant container 900 includes an air hose 903 attached to the container as well. Quick connect couplings may be provided at the ends of hoses 901, 902, 903 to facilitate establishing the connections described herein.

Figure 10A:
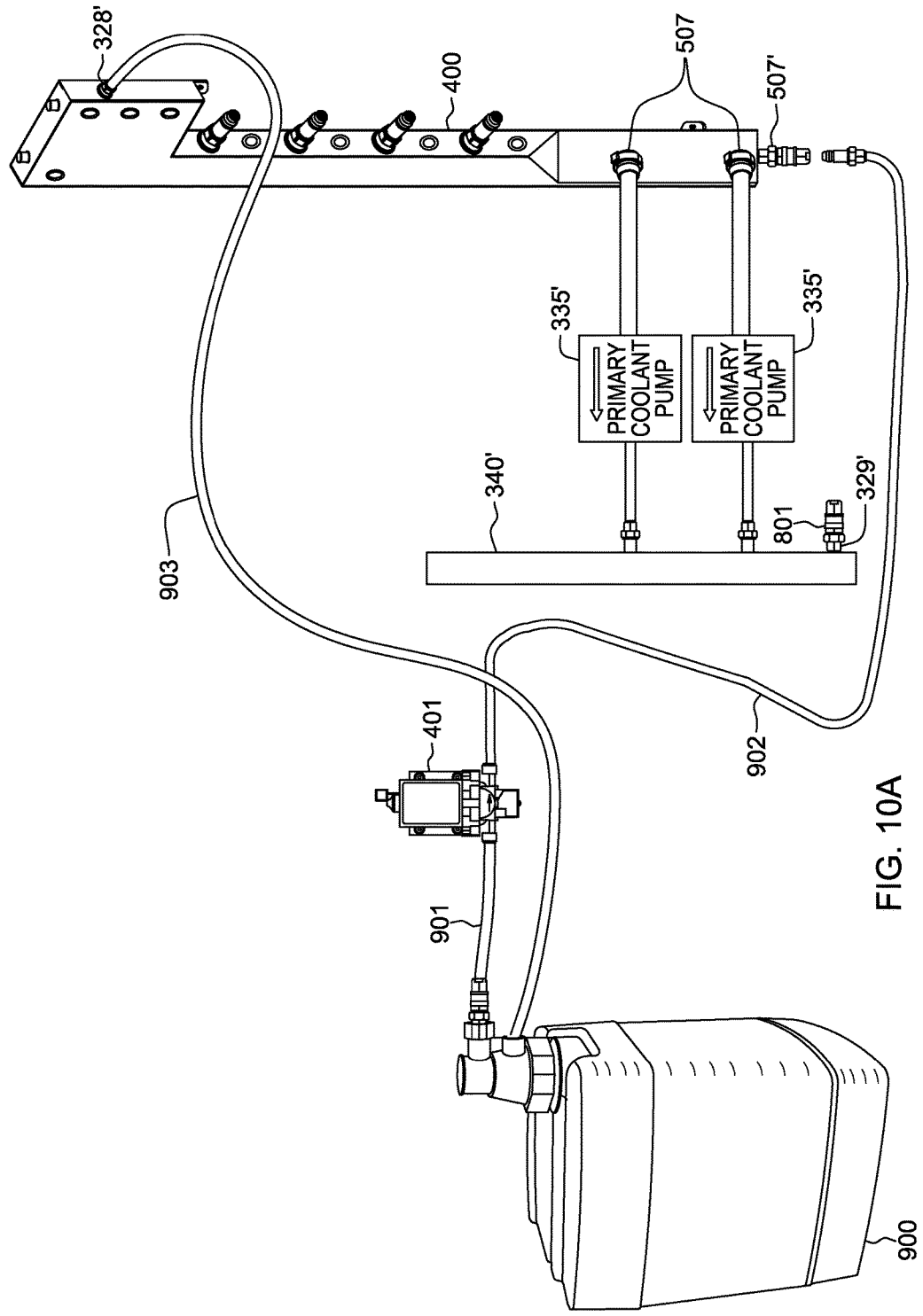
FIG. 10A depicts the assembly of FIG. 9, with the hoses shown connected to facilitate a coolant fill process, in accordance with one or more aspects of the present invention.

FIG. 10A depicts one configuration for a coolant fill process using the assembly of FIG. 9. As illustrated, hose 902 is coupled to quick connect coupling 507' at the lower region of manifold 400, and hose 901 is coupled to container 900 containing the coolant. Air hose 903 couples container 900 to bleed or fill port 328'. With these connections made, the control system controls activating and deactivating of pumps within the cooled electronic assembly, as well as monitoring of various sensors, such as the coolant level sensors described above.

Figure 10B:
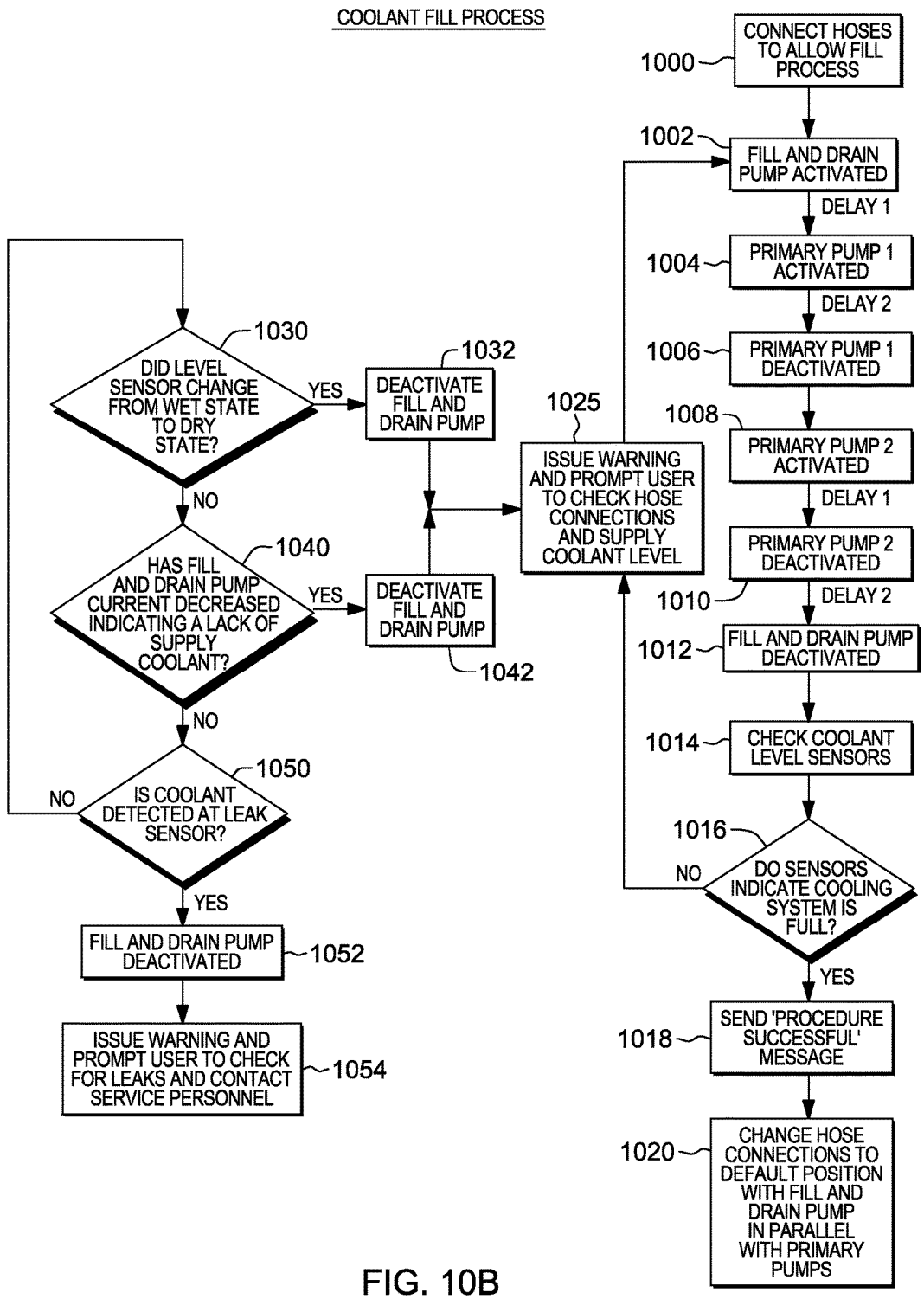
FIG. 10B depicts one embodiment of a coolant fill process using the assembly of FIG. 10A, in accordance with one or more aspects of the present invention.

FIG. 10B depicts one embodiment of control system control and monitoring of a coolant fill process using, for instance, the assembly of FIG. 10A. After personnel have connected the hoses described above to allow for the coolant fill process as shown in FIG. 10A 1000, the control system activates the fill and drain pump 1002, and waits a first time delay (such as 10 minutes) sufficient to allow the fill and drain pump, such as a positive displacement pump, to pump coolant into the cooling system from the container. After the first time delay, the control system activates a primary coolant pump, such as a first primary coolant pump 1004, and waits a second time delay, for instance, five minutes, to allow the coolant to circulate throughout the cooling system. The first primary coolant pump is then deactivated 1006, and the second primary coolant pump is activated 1008, after which the control system waits a further, second time interval, such as five minutes, to allow coolant to circulate through the second primary coolant pump and the cooling system, after which the second primary coolant pump is deactivated 1010, and the control system waits a further delay, such as one minute, before deactivating the fill and drain pump 1012. After deactivating the pumps, the control system checks the coolant level sensors 1014 to determine whether the sensors indicate that the cooling system is full 1016. If "yes", then a 'procedure successful' message is sent, for instance, to a repair and verify service panel associated with the cooled electronic assembly 1018. Thereafter, the hose connections are changed to their default position, with the fill and drain pump coupled in parallel with the primary coolant pumps, as described above in connection with FIGS. 5A, 6 & 8A 1020.

If the sensors indicate the system is not full, then the control system, in one or more embodiments, issues a warning and prompts service personnel to check hose connections and coolant supply level 1025. Note that in one or more embodiments, the coolant fill process is configured ahead of time to ensure that, if working properly, coolant levels should be at the desired system full level upon completion of the timed coolant pumping provided by the fill and drain pump, first primary coolant pump, and second primary coolant pump. Once the warning has been issued and the service personnel has checked hose connections and coolant supply level, then the coolant fill process may be repeated, if desired.

During the coolant fill process, the control system is monitoring for various conditions, which may require automatic action to be taken. For instance, the coolant fill process may be stopped and a warning triggered, should the level sensor change from a wet state to a dry state during the coolant fill process 1030. If "yes", then the fill and drain pump is deactivated 1032 and a warning is issued 1025. Also, if the fill and drain pump current is decreased during the coolant fill process 1040, the control system automatically deactivates the fill and drain pump 1042 and issues a warning 1025. The fill and drain pump current decreasing may indicate a lack of coolant supply. The control system also monitors the leak sensors and determines whether a coolant leak is detected. If "yes", the fill and drain pump is deactivated 1052 and the control system may issue a warning and prompt the service personnel to check for leaks 1054.

Figure 11A:
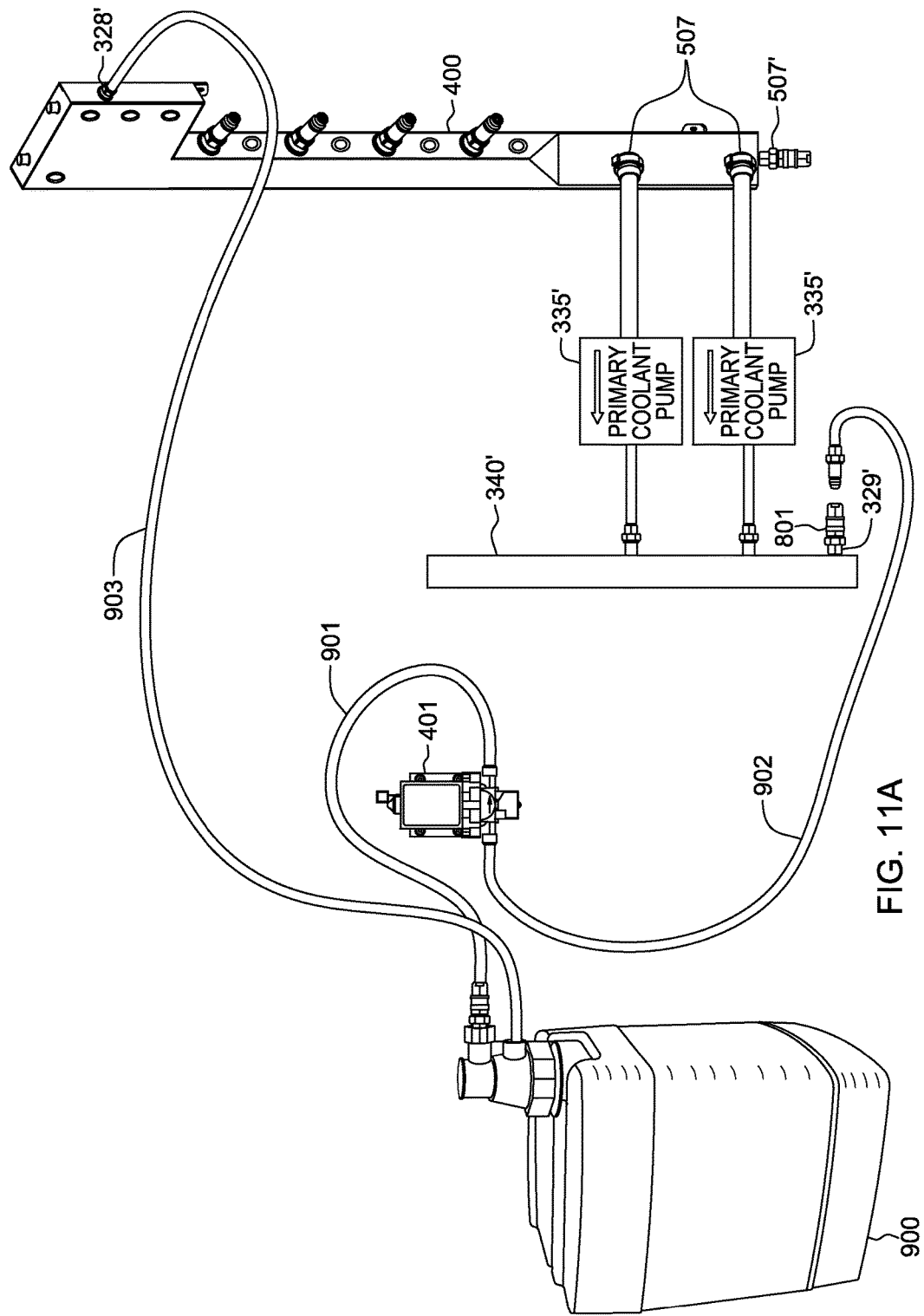
FIG. 11A depicts the assembly of FIG. 9, with the hoses shown connected to facilitate a coolant drain process, in accordance with one or more aspects of the present invention.

FIG. 11A depicts one configuration for a coolant drain process using the assembly of FIG. 9. As illustrated, hose 902 is coupled to quick connect coupling 801 at the fill/drain port 329' of commoning manifold 340' at the coolant inlet side to the heat removal section, and hose 901 is coupled to container 900, which is to receive coolant being drained from the cooling system. Hose 903 couples container 900 as illustrated to the bleed or fill port 328'. With these connections made, the control system controls activating and deactivating of the pumps within the cooled electronic assembly, as well as monitoring of various sensors, such as the sensors described above, to facilitate to coolant draining process.

Figure 11B:
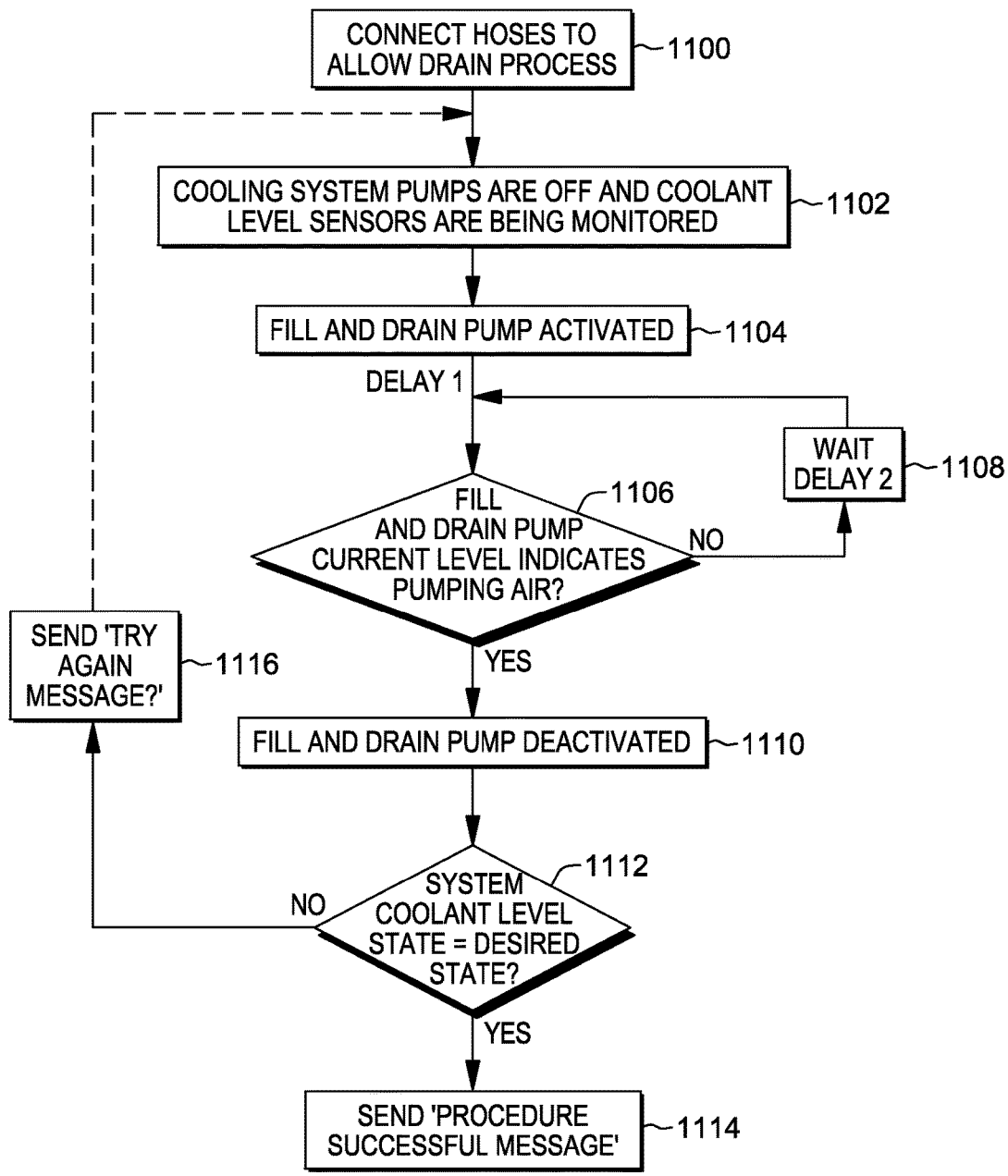
FIG. 11B depicts one embodiment of a coolant drain process using the assembly of FIG. 11A, in accordance with one or more aspects of the present invention.

FIG. 11B depicts one embodiment of the control system control and monitoring of coolant drain processing using, for instance, the assembly of FIG. 11A. The hoses are connected to allow for the drain process 1100. In addition, cooling system pumps are off, and the coolant level sensors are being monitored by the control system 1102. The control system activates the fill and drain pump 1104, and waits a first time delay, such as ten minutes, to allow the fill and drain pump to pump coolant from the cooling system into the container. After the first time delay, the control system inquires whether the fill and drain pump current level indicates that the fill and drain pump is pumping air 1106. If "no", then the control system waits a second time delay, for instance, five minutes, to allow the fill and drain pump to continue to drain coolant from the cooling system 1108. Once the fill and drain pump current level indicates that the fill and drain pump is pumping air, then the fill and drain pump is deactivated 1110, and the control system determines whether system coolant level state is at the desired state 1112. If "yes", then a 'procedure successful' message is sent, for instance, to a repair and verify service panel associated with the cooled electronic assembly 1114. Otherwise, a 'try again message?' may be sent to the repair and verify service panel, prompting service personnel to potentially initiate a repeat of the coolant drain process, if desired 1116.

Figure 12:
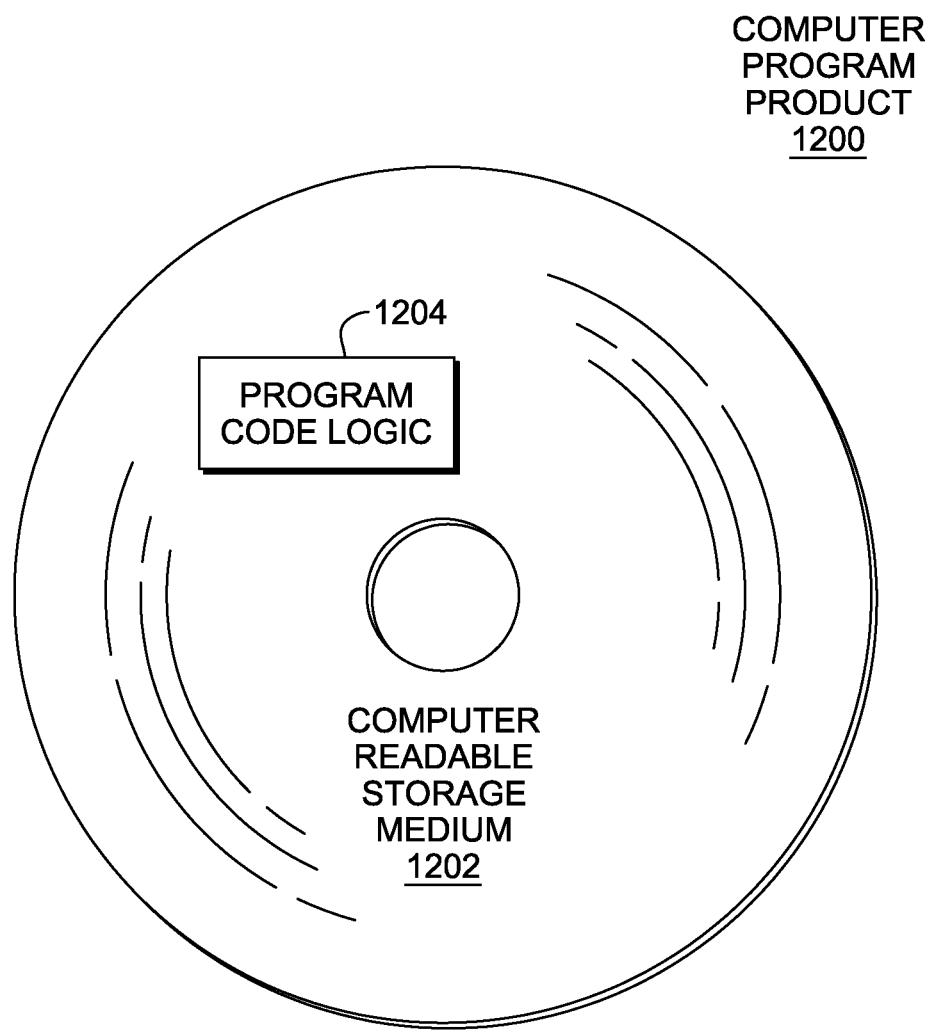
FIG. 12 depicts one embodiment of a computer program product incorporating one or more aspects of the present invention.

Referring to FIG. 12, in one example, a computer program product 1200 includes, for instance, one or more non-transitory computer readable storage media 1202 to store computer readable program code means, logic and/or instructions 1204 thereon to provide and facilitate one or more embodiments.

The control aspects present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that one or more blocks of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Although various embodiments are described above, these are only examples. For example, computing environments of other architectures can be used to incorporate and use one or more embodiments. Further, different instructions, instruction formats, instruction fields and/or instruction values may be used. Many variations are possible.

Further, other types of computing environments can benefit and be used. As an example, a data processing system suitable for storing and/or executing program code is usable that includes at least two processors coupled directly or indirectly to memory elements through a system bus. The memory elements include, for instance, local memory employed during actual execution of the program code, bulk storage, and cache memory which provide temporary storage of at least some program code in order to reduce the number of times code must be retrieved from bulk storage during execution.

Input/Output or I/O devices (including, but not limited to, keyboards, displays, pointing devices, DASD, tape, CDs, DVDs, thumb drives and other memory media, etc.) can be coupled to the system either directly or through intervening I/O controllers. Network adapters may also be coupled to the system to enable the data processing system to become coupled to other data processing systems or remote printers or storage devices through intervening private or public networks. Modems, cable modems, and Ethernet cards are just a few of the available types of network adapters.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components and/or groups thereof.

The corresponding structures, materials, acts, and equivalents of all means or step plus function elements in the claims below, if any, are intended to include any structure, material, or act for performing the function in combination with other claimed elements as specifically claimed. The description of one or more embodiments has been presented for purposes of illustration and description, but is not intended to be exhaustive or limited to in the form disclosed. Many modifications and variations will be apparent to those of ordinary skill in the art. The embodiment was chosen and described in order to best explain various aspects and the practical application, and to enable others of ordinary skill in the art to understand various embodiments with various modifications as are suited to the particular use contemplated.

What is claimed is:

1. A system comprising:
   a cooling system for cooling one or more electronic components, the cooling system comprising:
      a coolant circulation loop;
      at least one primary coolant pump coupled to facilitate circulating coolant through the coolant circulation loop; and a fill and drain pump to facilitate selective filling of the cooling system with the coolant in a fill mode, and draining of the coolant from the cooling system in a drain mode, the fill and drain pump being integrated with the cooling system in parallel with the at least one primary coolant pump as a backup coolant pump to the at least one primary coolant pump, the fill and drain pump circulating the coolant through the coolant circulation loop in a backup mode responsive to an error in the at least one primary coolant pump.

2. The system of claim 1, wherein the at least one primary coolant pump comprises a first type of coolant pump, and the fill and drain pump comprises a second type of coolant pump, the first type of coolant pump and the second type of coolant pump being different types of coolant pumps.

3. The system of claim 2, wherein the first type of coolant pump comprises a centrifugal-type pump or centripetal-type pump, and the second type of coolant pump comprises a positive displacement-type pump.

4. The system of claim 2, wherein the second type of coolant pump comprises a self-priming type of coolant pump.

5. The system of claim 1, wherein the cooling system further comprises a control system controlling the at least one primary coolant pump and the fill and drain pump, the control system automatically activating the fill and drain pump based on detection of the error in the at least one primary coolant pump, and the control system monitoring the cooling system during the selective filling of the cooling system with the coolant or the draining of the coolant from the cooling system.

6. The system of claim 5, wherein the cooling system comprises multiple primary coolant pumps coupled to the coolant circulation loop in parallel, the at least one primary coolant pump being at least one primary coolant pump of the multiple primary coolant pumps, and wherein the control system automatically activates the fill and drain pump based on detection of error in each primary coolant pump of the multiple primary coolant pumps.

7. The system of claim 1, wherein the cooling system further comprises at least one coolant filter associated with the at least one primary coolant pump, one coolant filter of the at least one coolant filter being disposed at or downstream of a coolant outlet of one primary coolant pump of the at least one primary coolant pump.

8. The system of claim 1, wherein the cooling system further comprises a control system, the control system automatically monitoring the selective filling of the cooling system with the coolant or the draining of the coolant from the cooling system by monitoring one or more parameters of the cooling system during a coolant filling operation or a coolant draining operation, respectively.

9. The system of claim 8, wherein the one or more parameters include one or more of coolant level within the cooling system, current being drawn by the fill and drain pump, or coolant leakage from the cooling system, and wherein the control system of the cooling system automatically issues a warning or automatically deactivates the fill and drain pump upon detection of an error in the one or more parameters of the cooling system being monitored during the coolant filling operation or the coolant draining operation.

10. The system of claim 1, wherein the cooling system further comprises:
a heat exchange assembly coupled in fluid communication with the coolant circulation loop to dissipate heat from the coolant passing therethrough; and
wherein the coolant circulation loop further includes a coolant manifold structure, the at least one primary coolant pump and the fill and drain pump being coupled in parallel-fluid communication between the coolant manifold structure and the heat exchange.

11. A cooled electronic assembly comprising:
multiple electronic systems to be cooled; and
a cooling system for cooling the multiple electronic systems, the cooling system comprising:
a coolant circulation loop comprising a coolant supply manifold and a coolant return manifold;
multiple cooling assemblies coupled in parallel fluid communication between the coolant supply manifold and the coolant return manifold to receive coolant from the coolant supply manifold, and exhaust coolant to the coolant return manifold, the multiple cooling assemblies being associated with the multiple electronic systems to facilitate removal of heat from the multiple electronic systems to coolant within the multiple cooling assemblies;
a heat exchange assembly coupled in fluid communication with the coolant circulation loop to dissipate heat from the coolant passing therethrough;
at least one primary coolant pump coupled to facilitate circulating coolant through the coolant circulation loop; and
a fill and drain pump to facilitate selective filling of the cooling system with the coolant in a fill mode, and draining of the coolant from the cooling system in a drain mode, the fill and drain pump being integrated with the cooling system in parallel with the at least one primary coolant pump as a backup coolant pump to the at least one primary coolant pump, the fill and drain pump circulating the coolant through the coolant circulation loop in a backup mode responsive to an error in the at least one primary coolant pump.

12. The cooled electronic assembly of claim 11, wherein the at least one primary coolant pump comprises a first type of coolant pump, and the fill and drain pump comprises a second type of coolant pump, the first type of coolant pump and the second type of coolant pump being different types of coolant pumps, and wherein the second type of coolant pump comprises a self-priming type of coolant pump.

13. The cooled electronic assembly of claim 12, wherein the first type of coolant pump comprises a centrifugal-type pump or centripetal-type pump, and the second type of coolant pump comprises a positive displacement-type pump.

14. The cooled electronic assembly of claim 11, wherein the cooling system further comprises a control system controlling the at least one primary coolant pump and the fill and drain pump, the control system automatically activating the fill and drain pump based on detection of the error in the at least one primary coolant pump, and the control system monitoring the cooling system during the selective filling of the cooling system with the coolant or the draining of the coolant from the cooling system.

15. The cooled electronic assembly of claim 14, wherein the cooling system comprises multiple primary coolant pumps coupled to the coolant circulation loop in parallel, the at least one primary coolant pump being at least one primary coolant pump of the multiple primary coolant pumps, and wherein the control system automatically activates the fill and drain pump based on detection of error in each primary coolant pump of the multiple primary coolant pumps.

16. The cooled electronic assembly of claim 11, wherein the cooling system further comprises at least one coolant filter associated with the at least one primary coolant pump, one coolant filter of the at least one coolant filter being disposed at or downstream of a coolant outlet of one primary coolant pump of the at least one primary coolant pump.

17. The cooled electronic assembly of claim 11, wherein the cooling system further comprises a control system, the control system automatically monitoring the selective filling of the cooling system with the coolant or the draining of the coolant from the cooling system by monitoring one or more parameters of the cooling system during a coolant filling operation or a coolant draining operation, respectively.

18. The cooled electronic assembly of claim 17, wherein the one or more parameters include one or more of coolant level within the cooling system, current being drawn by the fill and drain pump, or coolant leakage from the cooling system, and wherein the control system of the cooling system automatically issues a warning or automatically deactivates the fill and drain pump upon detection of an error in the one or more parameters of the cooling system being monitored during the coolant filling operation or the coolant draining operation.

* * * * *